(12) United States Patent
Kwon

(10) Patent No.: US 9,741,729 B2
(45) Date of Patent: Aug. 22, 2017

(54) NONVOLATILE MEMORY CELLS, NONVOLATILE MEMORY CELL ARRAYS INCLUDING THE SAME, AND METHODS OF FABRICATING THE SAME

(71) Applicant: SK hynix Inc., Gyeonggi-do (KR)

(72) Inventor: Young Joon Kwon, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 45 days.

(21) Appl. No.: 14/823,748

(22) Filed: Aug. 11, 2015

(65) Prior Publication Data
US 2016/0293615 A1    Oct. 6, 2016

(30) Foreign Application Priority Data
Apr. 6, 2015   (KR) .................. 10-2015-0048675

(51) Int. Cl.
| | |
|---|---|
| *H01L 27/115* | (2017.01) |
| *H01L 27/11524* | (2017.01) |
| *H01L 29/788* | (2006.01) |
| *H01L 21/28* | (2006.01) |
| *H01L 29/423* | (2006.01) |
| *H01L 29/66* | (2006.01) |

(52) U.S. Cl.
CPC .. *H01L 27/11524* (2013.01); *H01L 21/28273* (2013.01); *H01L 29/42324* (2013.01); *H01L 29/66825* (2013.01); *H01L 29/7883* (2013.01)

(58) Field of Classification Search
CPC ............. H01L 27/115; H01L 27/11521; H01L 21/28273; H01L 29/42324; H01L 29/66825; G11C 11/34; G11C 16/04
USPC .......................... 365/185.1, 185.27; 257/316
See application file for complete search history.

(56) References Cited

U.S. PATENT DOCUMENTS

| | | | |
|---|---|---|---|
| 6,525,969 B1 * | 2/2003 | Kurihara .................. | G11C 7/12 365/185.16 |
| 8,383,475 B2 | 2/2013 | Jung et al. | |
| 2009/0141554 A1 * | 6/2009 | Lojek ................. | G11C 16/0433 365/185.05 |

\* cited by examiner

*Primary Examiner* — Quoc Hoang
(74) *Attorney, Agent, or Firm* — IP & T Group LLP

(57) ABSTRACT

Nonvolatile memory devices includes a charge storage element having a MOS capacitor structure and including a control gate terminal connected to a word line and a body terminal connected to a body bias line, a first half-MOS transistor having a first selection gate terminal connected to the word line and a first impurity junction terminal connected to a bit line and sharing the body terminal with the charge storage element, and a second half-MOS transistor having a second selection gate terminal connected to the word line and a second impurity junction terminal connected to a source line and sharing the body terminal with the charge storage element. The charge storage element is coupled between the first and second half-MOS transistors so that the first half-MOS transistor, the charge storage element, and the second half-MOS transistor are connected in series.

9 Claims, 31 Drawing Sheets

PROGRAM OPERATION 1

PROGRAM OPERATION 2

ERASURE OPERATION

READ OPERATION

NONVOLATILE MEMORY CELLS, NONVOLATILE MEMORY CELL ARRAYS INCLUDING THE SAME, AND METHODS OF FABRICATING THE SAME

CROSS-REFERENCE TO RELATED APPLICATIONS

The present application claims priority under 35 U.S.C 119(a) to Korean Application No. 10-2015-0048675, filed on Apr. 6, 2015, which is herein incorporated by reference in its entirety as set forth in full.

BACKGROUND

1. Technical Field

Various embodiments of the present disclosure relate to nonvolatile memory devices and methods of fabricating the same and, more particularly, to nonvolatile memory cells, nonvolatile memory cell arrays including the same, and methods of fabricating the same.

2. Related Art

Electrically erasable programmable read only memory (EEPROM) devices and flash memory devices belong to nonvolatile memory devices that retain stored data even when a power supply is interrupted. Various memory cell structures of the nonvolatile memory devices have been proposed to improve performance. A typical unit memory cell of the nonvolatile memory devices employs a stack gate structure including a floating gate, an inter-gate dielectric layer, and a control gate which are sequentially stacked on a semiconductor substrate. As electronic systems become smaller with development of fabrication techniques of semiconductor devices, system-on-chip (SOC) products have been important devices for high performance digital systems. Each of the SOC products may include a plurality of semiconductor devices executing various functions in a single chip. For example, the SOC product may include at leash one logic device and at least one memory device which are integrated in a single chip. Thus, fabrication technologies of embedded nonvolatile memory devices may be required to embed the nonvolatile memory devices in the SOC products.

To embed the nonvolatile memory devices in the SOC products, the process technology of the nonvolatile memory devices has to be compatible with the process technology of the logic device included in the SOC products. In general, logic devices employ transistors having a single gate structure, whereas nonvolatile memory devices employ cell transistors having a stack gate structure that is, a double gate structure. Thus, the SOC products including the nonvolatile memory devices and the logic devices may require a complicated process technology. Accordingly, single-layered gate nonvolatile memory devices employing a single-layered gate cell structure are very appropriate for the embedded nonvolatile memory devices. That is, complementary metal-oxide-semiconductor (CMOS) circuits of the logic devices may be readily realized using a process technology of the single-layered gate nonvolatile memory devices. As a result, the process technology of the single-layered gate nonvolatile memory devices may be widely used in fabrication of the SOC products including the embedded nonvolatile memory devices.

SUMMARY

Various embodiments are directed to nonvolatile memory cells, nonvolatile memory cell arrays including the same, and methods of fabricating the same.

According to an embodiment, there is provided a nonvolatile memory cell. The nonvolatile memory cell includes a charge storage element having a MOS capacitor structure and including a control gate terminal connected to a word line and a body terminal connected to a body bias line, a first half-MOS transistor having a first selection gate terminal connected to the word line and a first impurity junction terminal connected to a bit line and sharing the body terminal with the charge storage element, and a second half-MOS transistor having a second selection gate terminal connected to the word line and a second impurity junction terminal connected to a source line and sharing the body terminal with the charge storage element, wherein the charge storage element is coupled between the first and second half-MOS transistors so that the first half-MOS transistor, the charge storage element, and the second half-MOS transistor are connected in series.

According to another embodiment, there is provided a nonvolatile memory cell. The nonvolatile memory cell includes a body having a first channel region, a second channel region, and a third channel region, wherein the first channel region is provided between the second and the third channel regions, a first impurity junction region disposed in an upper region of the body, wherein the second channel region is provided between the first channel region and the first impurity junction region, a second impurity junction region disposed in an upper region of the body, wherein the third channel region is provided between the first channel region and the second impurity junction region, a tunnel insulation layer and a floating gate sequentially stacked over the first channel region, an insulation layer covering sidewalls and a top surface of the floating gate and extending over the second and the third channel regions, an interlayer insulation layer disposed over the first and second impurity junction regions and the insulation layer, a first contact plug disposed in the interlayer insulation layer and extending from over the floating gate to over the second and the third channel regions, and a second contact plug and a third contact plug penetrating the interlayer insulation layer and coupled to the first impurity junction region and the second impurity junction region, respectively.

According to another embodiment, there is provided a nonvolatile memory cell array including a plurality of unit cells arrayed in rows and columns to have a matrix form. Each of the plurality of unit cells includes a charge storage element having a MOS capacitor structure including a control gate terminal connected to a word line and a body terminal connected to a body bias line, a first half-MOS transistor having a first selection gate terminal connected to the word line and a first impurity junction terminal connected to a bit line and sharing the body terminal with the charge storage element, and a second half-MOS transistor having a second selection gate terminal connected to the word line and a second impurity junction terminal connected to a source line and sharing the body terminal with the charge storage element, wherein the charge storage element is coupled between the first and second half-MOS transistors so that the first half-MOS transistor, the charge storage element and the second half-MOS transistor are connected in series.

According to another embodiment, there is provided a nonvolatile memory cell array. The nonvolatile memory cell array includes active regions extending in a first direction and spaced apart from each other in a second direction intersecting the first direction, bodies respectively surrounding the active regions, floating gates arrayed in the first direction over each of the active regions, first contact plugs extending in the second direction to intersect the active regions and spaced apart from each other in the first direction, wherein each of the floating gates and the active region adjacent to each of the floating gates are covered with any one of the first contact plugs, first impurity junction regions and second impurity junction regions alternately arrayed along the first direction in each of the active regions so that the first contact plugs are disposed over the active regions between the first and second impurity junction regions, and second contact plugs and third contact plugs disposed over the first impurity junction regions and the second impurity junction regions, respectively.

According to another embodiment, there is provided a method of fabricating a nonvolatile memory device. The method includes sequentially forming a first insulation layer and a floating gate over a well region disposed in a substrate, sequentially forming a second insulation layer and a spacer insulation layer over the first insulation layer to cover the floating gate, anisotropically etching the spacer insulation layer to form a first spacer and a second spacer over sidewalls of the second insulation layer, respectively, implanting impurity ions into the well region to form a first impurity junction region and a second impurity junction region which are self-aligned, respectively with the first and second spacers, forming a third insulation layer over the floating gate, forming an interlayer insulation layer that covers the first and second impurity junction regions, the first and second spacers, and the third insulation layer, patterning the interlayer insulation layer to form a contact hole exposing the first impurity junction region, a second contact hole exposing the second impurity junction region, and a third contact hole exposing the first and second spacers and the third insulation layer removing the first and second spacers exposed by the third contact hole to expand the third contact hole, and filling the first contact hole, the second contact hole, and expanded third contact hole with a metal layer.

According to another embodiment, there is provided a nonvolatile memory cell array including a first unit cell (200a) including a first charge storage transistor (210a), a first selection transistor (220a), and a second selection transistor (230a), and a second unit cell (200b) including a second charge storage transistor (210b), a third selection transistor (220b) and a fourth selection transistor (230b), wherein the first charge storage transistor (210a), the first selection transistor (220a), and the second selection transistor (230a) are commonly coupled to a first word line (WL1), wherein the second charge storage transistor (210b) the third selection transistor (220b), and the fourth selection transistor (230b) are commonly coupled to a second word line (WL2), wherein the first and the third selection transistors (220a, 220b) are commonly coupled to a first bit line (BL), and wherein the second and the fourth selection transistors (230a, 230b) are commonly coupled to a first source line (SL).

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms first, second, third etc, may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
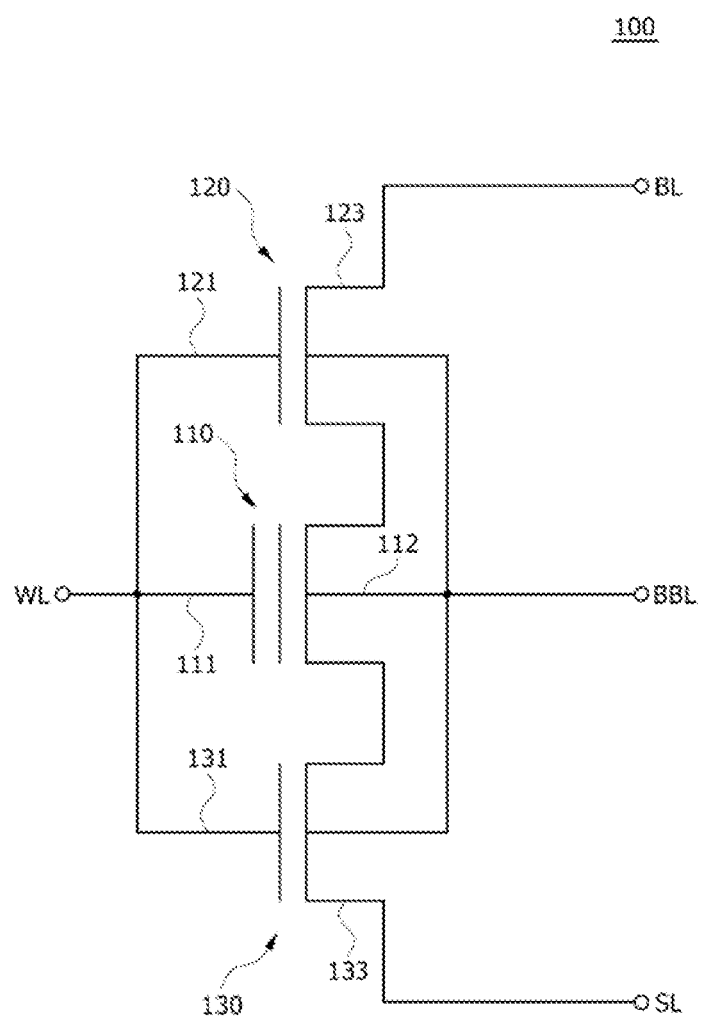
FIG. 1 is an equivalent circuit diagram illustrating a unit cell of a nonvolatile memory device according to an embodiment.

FIG. 1 is an equivalent circuit diagram illustrating a unit cell 100 of a nonvolatile memory device according to an embodiment. Referring to FIG. 1, the unit cell 100 may include a charge storage element also referred to as a charge storage transistor 110, a first selection transistor 120 and a second selection transistor 130. The charge storage element 110 may be coupled between the first and second selection transistors 120 and 130. The first selection transistor 120, the charge storage element 110, and the second selection transistor 130 may be connected in series. The charge storage element 110 may have a MOS capacitor having a control gate terminal 111 and a body terminal 112. For example, the charge storage element 110 may be configured to include a body such as, a bulk region or a well region serving as the body terminal 112, a first insulation layer disposed on the body, a floating gate disposed on the insulation layer, and a control gate overlapping with the floating gate and serving as the control gate terminal 111.

When a given voltage is applied to the control gate terminal 111, a coupling voltage may be induced at the floating gate. The first selection transistor 120 may be a half-MOS transistor having a first selection gate terminal 121 and a first impurity junction terminal 123. The second selection transistor 130 may also be a half-MOS transistor having a second selection gate terminal 131 and a second impurity junction terminal 133. All of the charge storage element 110 and the first and second selection transistors 120 and 130 may share the body terminal 112 with each other. For example, all of the charge storage element 110 and the first and second selection transistors 120 and 130 may be disposed on a single body.

The control gate terminal 111 of the charge storage element 110, the first selection gate terminal 121 of the first selection transistor 120, and the second selection gate terminal 131 of the second selection transistor 130 may be coupled to a single word line WL. The first impurity junction terminal 123 of the first selection transistor 120 may be coupled to a bit line BL, and the second impurity junction terminal 133 of the second selection transistor 130 may be coupled to a source line SL. The body terminal 112 that the charge storage element 110 and the first and second selection transistors 120 and 130 share with each other may be coupled to a body bias line BBL. According to the unit cell 100 described above, the charge storage element 110 may be coupled between the first and second selection transistors 120 and 130 that share the word line WL with the charge storage element 110. Thus, even though the unit cell 100 of the nonvolatile memory device is over-erased, a read operation of another unit cell (not shown) sharing the bit line BL with the unit cell 100 and being in a programmed state, may be normally performed without any error which may be caused due to the over erasure of the unit cell 100. An erroneous read operation due to the over erasure will be described in detail below.

Figure 2:
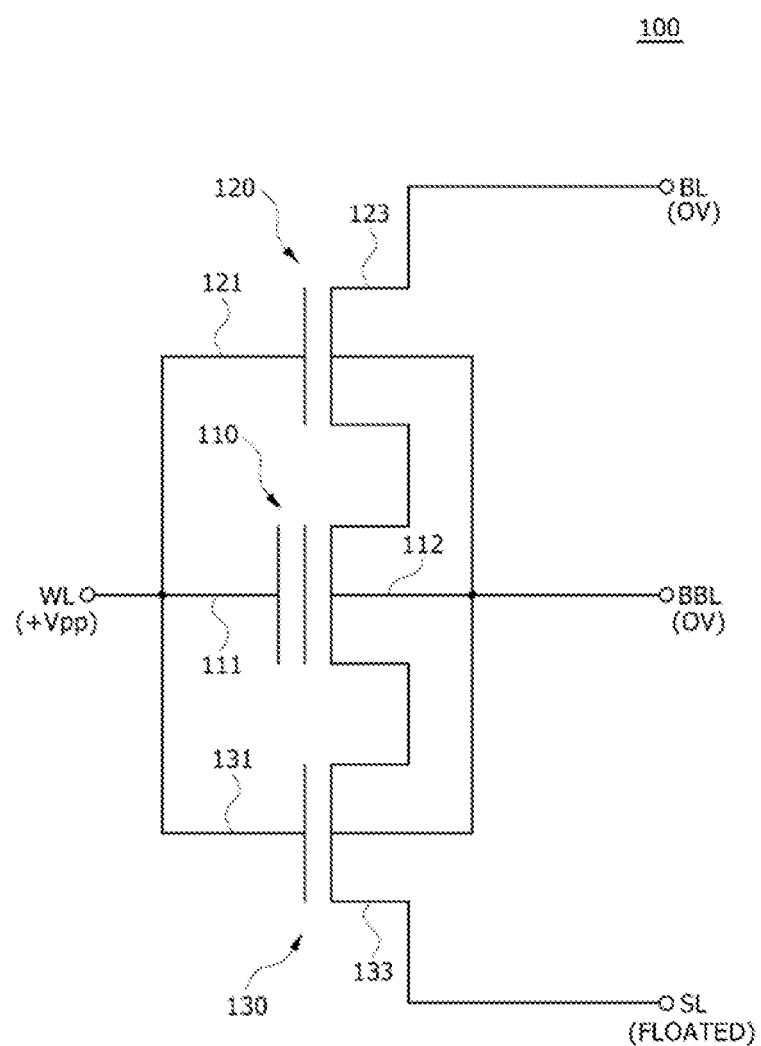
FIG. 2 is an equivalent circuit diagram illustrating a program operation of a unit cell shown in FIG. 1.

FIG. 2 is an equivalent circuit diagram illustrating a program operation of the unit cell 100 shown in FIG. 1. The program operation of the unit cell 100 illustrated in FIG. 2 will be described in conjunction with an example in which all of the first and second selection transistors 120 and 130 and the charge storage element 110 constituting the unit cell 100 have N-channel MOS structures. However, even in the unit cell 100 having P-channel MOS structures, in which all of the first and second selection transistors 120 and 130 and the charge storage element 110 constituting the unit cell 100 have P-channel MOS structures, a program condition of the unit cell 100 may be substantially the same as the program condition of the unit cell 100 having N-channel MOS structures except a bias polarity. In FIG. 2, the same reference numerals or characters as used in FIG. 1 denote the same or like elements.

Referring to FIG. 2, a positive program voltage +Vpp may be applied to the word line WL to program the unit cell 100. The bit line BL and the body bias line BBL may be grounded, and the source line SL may be floated. When the positive program voltage +Vpp is applied to the word line WL, a certain coupling voltage may be induced at the floating gate of the charge storage element 110. Accordingly, an electric field may be created across the insulation layer between the floating gate and the body terminal 112 of the charge storage element 110 due to a voltage difference between the coupling voltage induced at the floating gate and the ground voltage applied to the body terminal 112 through the body bias line BBL.

Thus, electrons in the body corresponding to the body terminal 112 may be injected into the floating gate through the insulation layer by a Fowler-Nordheim (F-N) tunneling mechanism. When electrons in the body are injected into the floating gate, a threshold voltage of the charge storage element 110 having a MOS capacitor structure may increase so that the unit cell 100 has a programmed state for example, a logic "low (zero)" state or an off state.

During the program operation, both of the first and second selection transistors 120 and 130 are turned on to form channel inversion layers therein. Therefore, the electrons injected into the floating gate of the charge storage element 110 by an F-N tunneling mechanism may be supplied through the channel inversion layer of the first selection transistor 120 having the first impurity junction terminal 123 to which a ground voltage is applied through the bit line BL.

Figure 3:
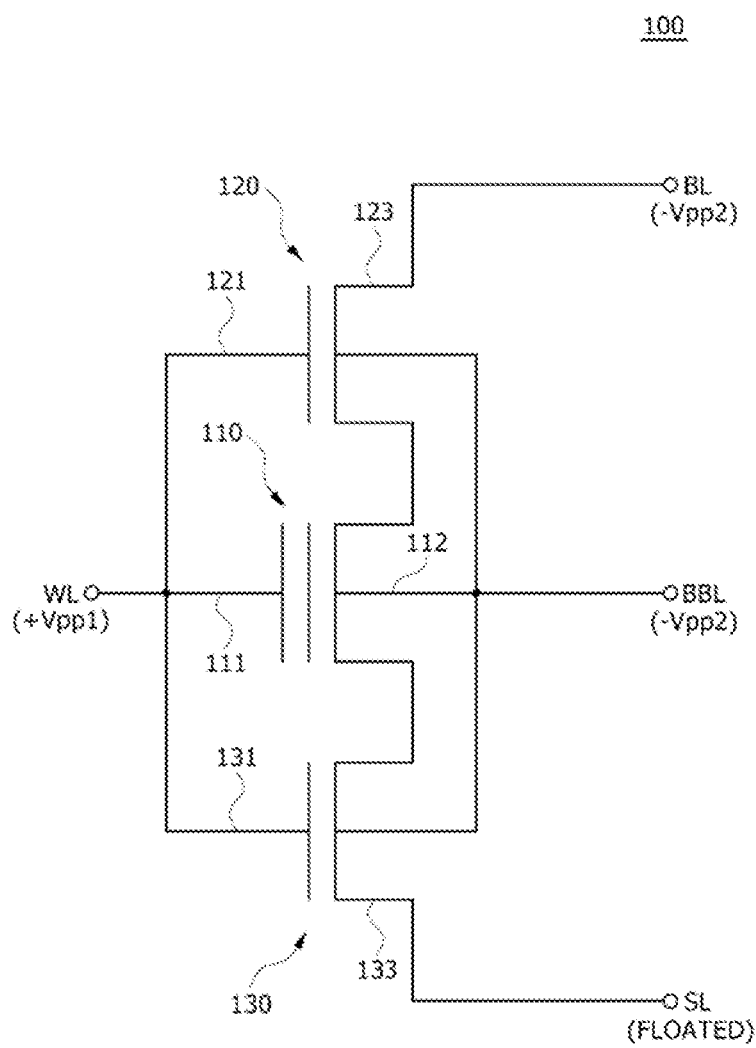
FIG. 3 is an equivalent circuit diagram illustrating another program operation of the unit cell shown in FIG. 1.

FIG. 3 is an equivalent circuit diagram illustrating another program operation of the unit cell 100 shown in FIG. 1. The program operation of the unit cell 100 illustrated in FIG. 3 will be described in conjunction with an example in which all of the first and second selection transistors 120 and 130 and the charge storage element 110 constituting the unit cell 100 have N-channel MOS structures. However, even though all of the first and second selection transistors 120 and 130 and the charge storage element 110 constituting the unit cell 100 have P-channel MOS structures, a program condition of the unit cell 100 having P-channel MOS structures may be substantially the same as a program condition of the unit cell 100 having N-channel MOS structures except for a bias polarity. In FIG. 3, the same reference numerals or characters as used in FIG. 1 denote the same elements.

Referring to FIG. 3, a first program voltage +Vpp1 having a positive polarity may be applied to the word line WL to program the unit cell 100. In addition, a second program voltage −Vpp2 having a negative polarity may be applied to the bit line BL and the body bias line BBL, and the source line SL may be floated. The first program voltage +Vpp1 may be lower than the program voltage +Vpp applied to the word lines WL in the program operation described with reference to FIG. 2. When the first program voltage +Vpp1 is applied to the word line WL, a certain coupling voltage may be induced at the floating gate of the charge storage element 110. Accordingly, an electric field may be created across the insulation layer between the floating gate and the body terminal 112 of the charge storage element 110 due to a voltage difference between the coupling voltage induced at the floating gate and the second program voltage −Vpp2 applied to the body terminal 112 through the body bias line BBL.

Therefore, electrons in the body corresponding to the body terminal 112 may be injected into the floating gate through the insulation layer by an F-N tunneling mechanism. When the electrons in the body are injected into the floating gate, a threshold voltage of the charge storage element 110 having a MOS capacitor structure may increase so that the unit cell 100 has a programmed state for example, a logic "low (zero)" state or an off state.

During the program operation, the second program voltage Vpp2 may be applied to both of the body terminal 112 and the first impurity junction terminal 123 constituting a PN junction. Accordingly, the PN junction comprised of the body terminal 112 and the first impurity junction terminal 123 may maintain an equilibrium state in electric potential not affecting the program operation.

Figure 4:
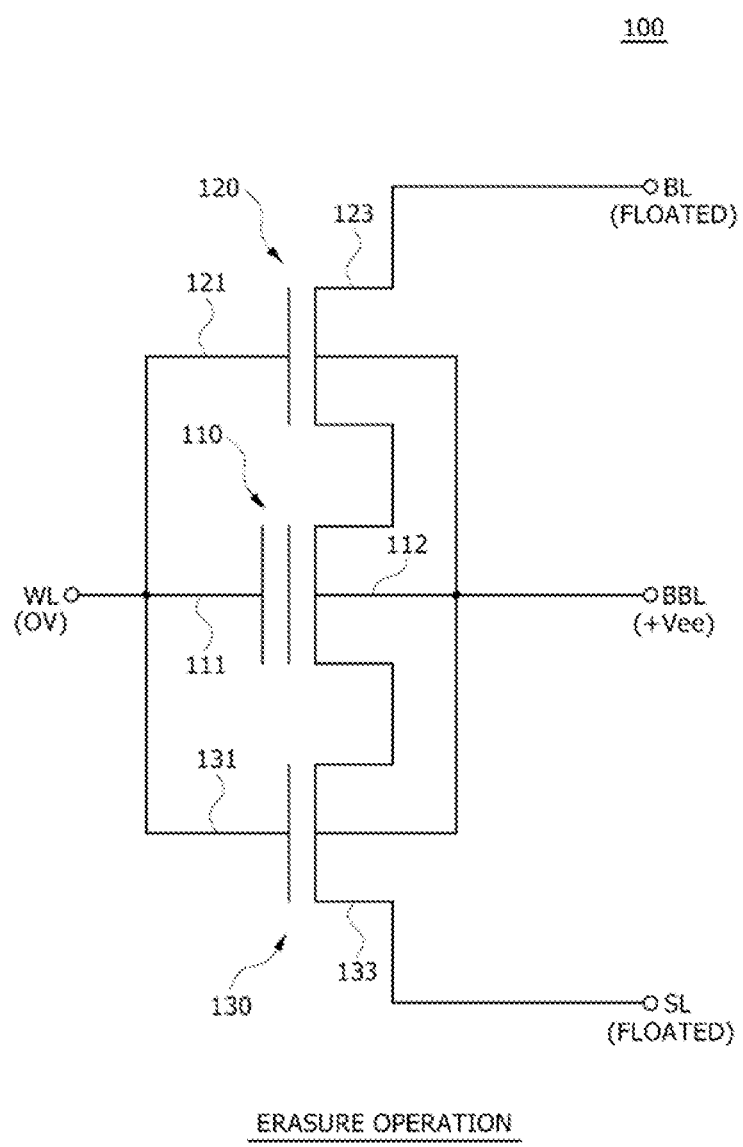
FIG. 4 is an equivalent circuit diagram illustrating an erasure operation of the unit cell shown in FIG. 1.

FIG. 4 is an equivalent circuit diagram illustrating an erasure operation of the unit cell 100 shown in FIG. 1. The erasure operation will be described in conjunction with an example in which all of the first and second selection transistors 120 and 130 and the charge storage element 110 constituting the unit cell 100 have N-channel MOS structures. However, even when all of the first and second selection transistors 120 and 130 and the charge storage element 110 constituting the unit cell 100 have P-channel MOS structures, an erasure condition of the unit cell 100 having P-channel MOS structures may be substantially the same as an erasure condition of the unit cell 100 having N-channel MOS structures except a bias polarity. In FIG. 4, the same reference numerals or characters as used in FIG. 1 denote the same elements.

Referring to FIG. 4, to erase the unit cell 100, the word line WL may be grounded and a positive erasure voltage +Vee may be applied to the body bias line BBL. The source line SL and the bit line BL may be floated. In such a case, electrons stored in the floating gate of the charge storage element 110 may be injected into the body through the insulation layer between the floating gate and the body by an F-N tunneling mechanism, due to an electric field created by a voltage difference between a coupling voltage induced at the floating gate and the positive erasure voltage +Vee applied to the body terminal 112 through the body bias line BBL.

When electrons in the floating gate are injected into the body, a threshold voltage of the charge storage element 110 having a MOS capacitor structure may be lowered so that the unit cell 100 has an erased state for example, a logic "high (one)" state or an on state.

Figure 5:
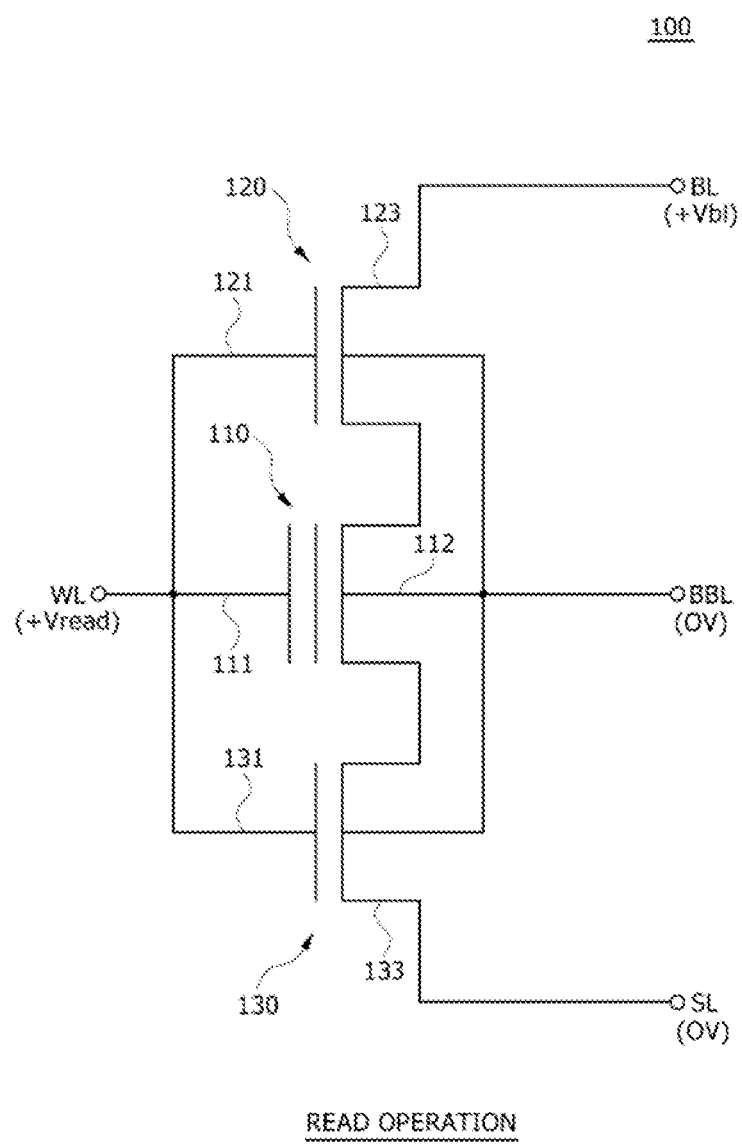
FIG. 5 is an equivalent circuit diagram illustrating a read operation of the unit cell shown in FIG. 1.

FIG. 5 is an equivalent circuit diagram illustrating a read operation of the unit cell 100 shown in FIG. 1. The read operation will be described in conjunction with an example in which all of the first and second selection transistors 120 and 130 and the charge storage element 110 constituting the unit cell 100 have N-channel MOS structures. However, even when all of the first and second selection transistors 120 and 130 and the charge storage element 110 constituting the unit cell 100 have P-channel MOS structures, a read condition of the unit cell 100 having P-channel MOS structures may be substantially the same as a read condition of the unit cell 100 having N-channel MOS structures except for a bias polarity. In FIG. 5, the same reference numerals or characters as used in FIG. 1 denote the same elements.

Referring to FIG. 5, a positive read voltage +Vread may be applied to the word line WL to execute the read operation of the unit cell 100. In addition, a positive bit line voltage +Vbl may be applied to the bit line BL, and the source line SL and the body bias line BBL may be grounded. When the positive read voltage +Vread is applied to the word line WL, the first and second selection transistors 120 and 130 may be turned on and a certain coupling voltage may be induced at the floating gate of the charge storage element 110. The positive read voltage +Vread may be set to have a voltage level between a threshold voltage of the programmed charge storage element 110 and a threshold voltage of the erased charge storage element 110. Since both of the first and second selection transistors 120 and 130 are turned on during the read operation, an amount of current flowing into the source line SL through the bit line BL may be determined whether or not the charge storage element 110 has a channel inversion layer therein.

That is, when electrons exist in the floating gate of the charge storage element 110, that is, the unit cell 100 is in a programmed state, no channel inversion layer is formed in the charge storage element 110 even though the positive read voltage +Vread is applied to the word line WL since a threshold voltage of the charge storage element 110 in the programmed state is higher than the positive read voltage +Vread. Thus, no current flows through the bit line BL and the source line SL.

In contrast, when electrons stored in the floating gate of the charge storage element 110 are removed, that is, the unit cell 100 is in an erased state, a channel inversion layer may be formed in the charge storage element 110 when the positive read voltage +Vread is applied to the word line WL since a threshold voltage of the charge storage element 110 in the erased state is lower than the positive read voltage +Vread. Thus, a current may flow through the bit line BL and the source line SL. Accordingly, a sense amplifier (not shown) connected to the bit line BL may sense the bit line current. That is, checking whether a current is detected by the sense amplifier can determine whether the unit cell 100 is in a programmed state or in an erased state. When the current is detected, a data signal "high" is output. When the current is not detected, a data signal "low" is output.

Figure 6:
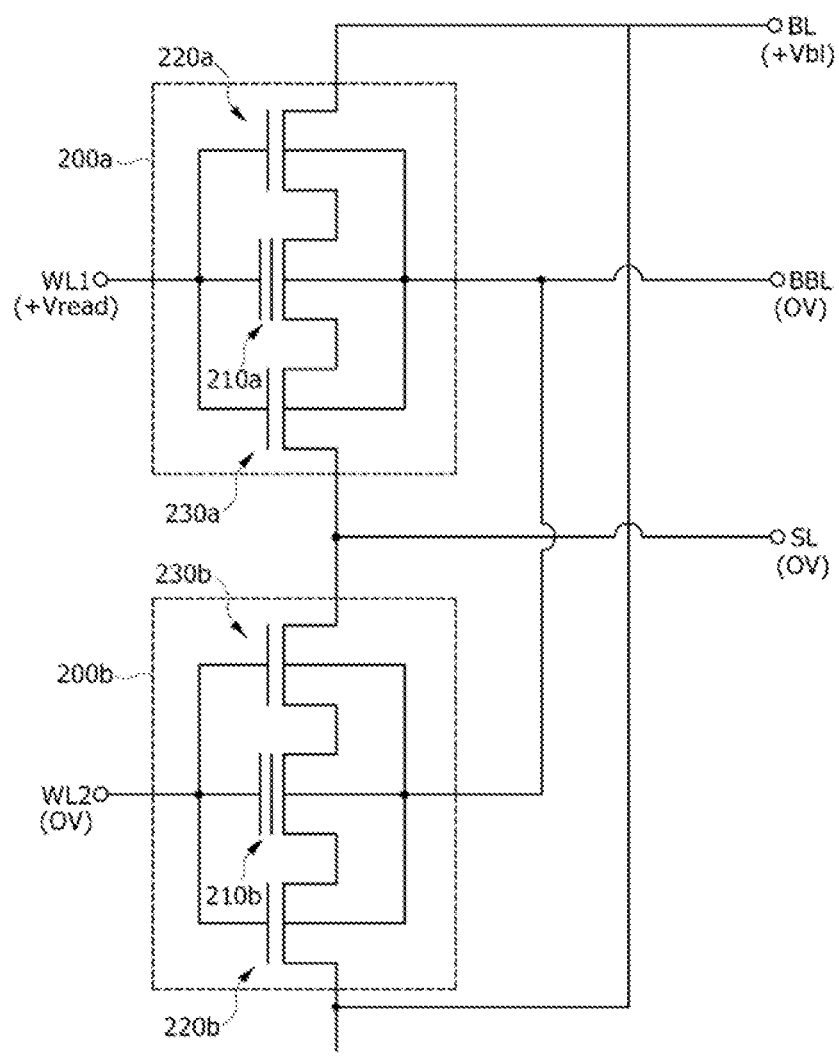
FIG. 6 is an equivalent circuit diagram illustrating a mechanism for preventing an erroneous read operation from occurring due to an over erasure of the unit cell shown in FIG. 1.

FIG. 6 is an equivalent circuit diagram illustrating a mechanism that prevents an erroneous read operation occurring due to an over erasure of a unit cell shown in FIG. 1. Referring to FIG. 6, a first unit cell 200a and a second unit cell 200b may be arrayed to share a bit line BL and a source line SL with each other. Each of the first and second unit cells 200a and 200b may have the same configuration as the unit cell 100 shown in FIG. 1.

To execute a read operation of the first unit cell 200a, a positive read voltage +Vread may be applied to a first word line WL1 connected to the first unit cell 200a and a ground voltage may be applied to a second word line WL2 connected to the second unit cell 200b. In addition, a positive bit line voltage +Vbl may be applied to the bit line BL which is connected to the first and second unit cells 200a and 200b in common, and the source line SL and a body bias line BBL connected to the first and second unit cells 200a and 200b in common may be grounded.

Under the above bias condition, when the first unit cell 200a has a programmed state so that a threshold voltage of a charge storage element 210a of the first unit cell 200a is higher than the positive read voltage +Vread, no channel inversion layer is formed in the charge storage element 210a. Thus, no current flows through the charge storage element 210a of the first unit cell 200a even though the first and second selection transistors 220a and 230a are turned on, as described with reference to FIG. 5.

When the second unit cell 200b is in a normal erase state and has a positive threshold voltage, no channel inversion layer is formed in a charge storage element 210b of the second unit cell 200b since the second word line WL2 is grounded. Thus, no current flows through the bit line BL during the read operation of the first unit cell 200a regardless of whether the second unit cell 200b has a programmed state or an erased state.

In the event that second unit cell 200b is over-erased, the read operation of the first unit cell 200a may be abnormally executed. More specifically, when the second unit cell 200b is in an over-erased state and, as a result, has a negative threshold voltage, a channel inversion layer may be formed in the charge storage element 210b of the second unit cell 200b which serves as an undesired current path even though the second word line WL2 is grounded. Thus, if the second unit cell 200b is designed without the first select transistor 220b and the second select transistor 230b, a current may flow through the bit line BL during the read operation of the first unit cell 200a in a programmed state. That is, the nonvolatile memory device may erroneously recognize that the first unit cell 200a is in an erased unit cell even though the first unit cell 200a is actually in a programmed state.

However, according to an embodiment, such error may be prevented by adding the first and second selection transistors 220b and 230b to the second unit cell 200b. The charge storage element 210b may be coupled between the first and second selection transistors 220b and 230b. The first and second selection transistors 220b and 230b and the charge storage element 210b may be designed to share the second word line with each other.

In this structure, even if the second unit cell 200b is in an over-erased state and thus a channel inversion layer is formed in the second unit cell 200b, the first and second selection transistors 220b and 230b may be turned off to prevent an undesired current from flowing through the bit line BL during the read operation of the first unit cell 200a having a programmed state.

Figure 7:
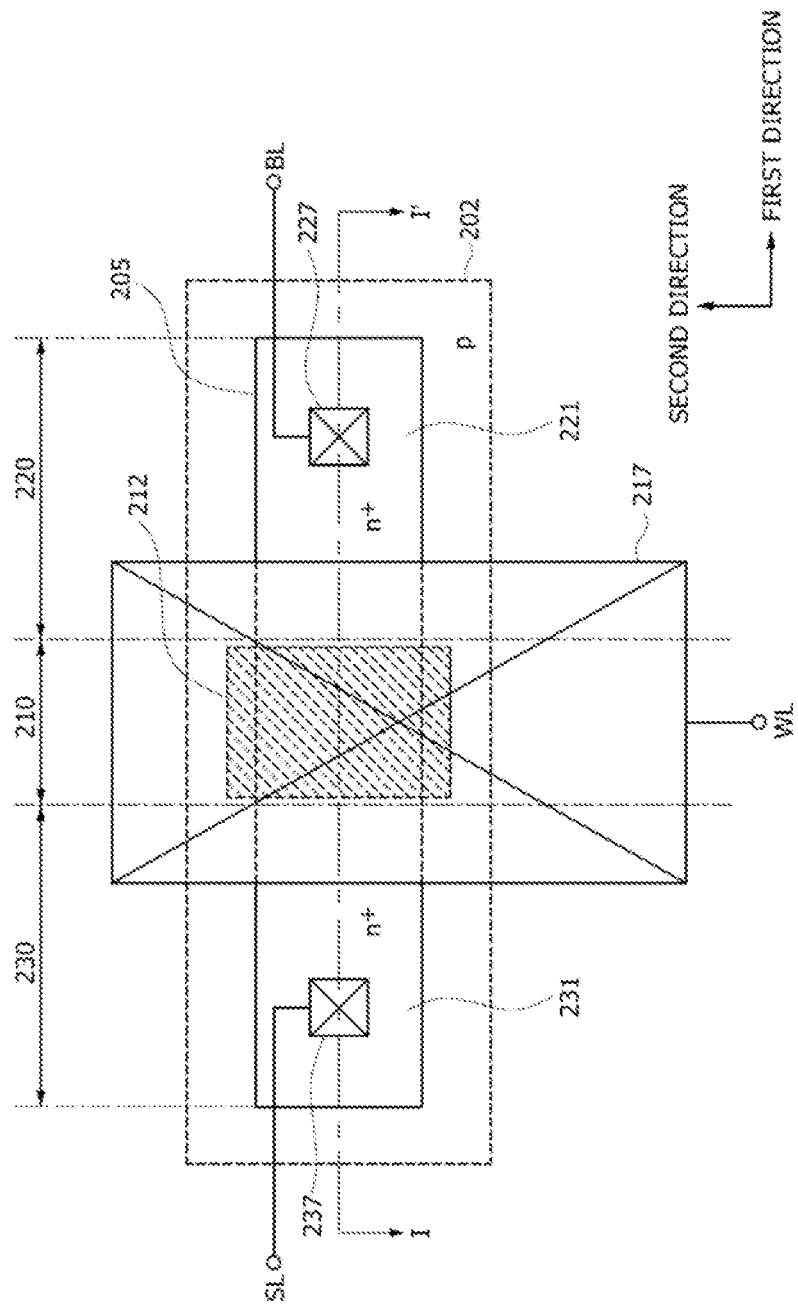
FIG. 7 is a layout diagram illustrating a unit cell of a nonvolatile memory device according to an embodiment.

FIG. 7 is a layout diagram illustrating a unit cell of a nonvolatile memory device according to an embodiment. Referring to FIG. 7, an active region 205 may be disposed to elongate in a first direction. The active region 205 may be defined by an isolation region. The active region 205 may be surrounded by a body 202 of a first conductivity type, for example, a P-type body 202. In some embodiments, the P-type body 202 may be a P-type well region. A first impurity junction region 221 of a second conductivity type for example, an N-type and a second impurity junction region 231 of the second conductivity type may be disposed in both ends of the active region 205, respectively.

A first contact plug 217 may be disposed to elongate in a second direction so that the first contact plug 217 intersects the active region 205 between the first and second impurity junction regions 221 and 231. The active region 205 overlapping with the first contact plug 217 may correspond to a portion of the P-type body 202. A floating gate 212 may be disposed between the first contact plug 217 and the active region 205 and may be insulated from the first contact plug 217 and the active region 205. The floating gate 212 may overlap with a portion of the first contact plug 217.

Although not shown in a layout of FIG. 7, sidewalls and a top surface of the floating gate 212 may be surrounded by the first contact plug 217. The first contact plug 217 may be connected to a word line WL. A second contact plug 227 may be disposed on the first impurity junction region 221, and a third contact plug 237 may be disposed on the second impurity junction region 231. The second and third contact plugs 227 and 237 may be connected to a bit line BL and a source line SL, respectively.

The P-type body 202, the floating gate 212, and the first contact plug 217 may constitute a charge storage element 210 having a MOS capacitor structure. In the charge storage element 210, the first contact plug 217 may serve as a control gate. The P-type body 202, the first impurity junction region 221, and the first contact plug 217 may constitute a first selection transistor 220 having a half-MOS transistor structure. In the first selection transistor 220, the first contact plug 217 may serve as a first selection gate. The P-type body 202, the second impurity junction region 231, and the first contact plug 217 may constitute a second selection transistor 230 having a half-MOS transistor structure. In the second selection transistor 230, the first contact plug 217 may serve as a second selection gate.

Figure 8:
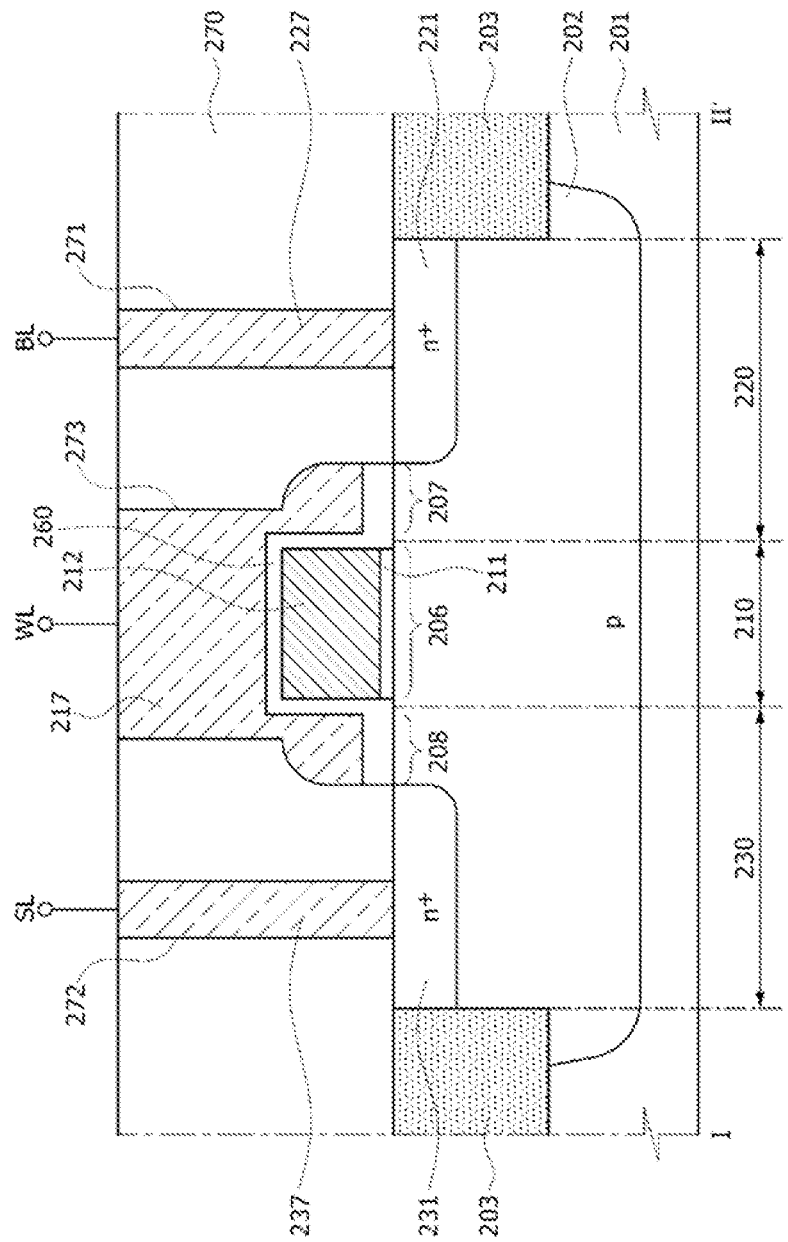
FIG. 8 is a cross-sectional view taken along the line I-I' of FIG. 7.

FIG. 8 is a cross-sectional view taken along a line I-I' of FIG. 7. Referring to FIGS. 7 and 8, the P-type body 202 may be disposed on a portion of a substrate 201. In some embodiments, the P-type body 202 may be a P-type well region. A portion of the P-type body 202 may correspond to the active region (205 of FIG. 7). The active region 205 may be defined by an isolation region in which a trench isolation layer 203 is disposed.

The first impurity junction region 221 having the second conductivity type that is, an N-type and the second impurity junction region 231 having the second conductivity type may be respectively disposed in both upper ends of the active region 205 spaced apart from each other. The active region 205 between the first and second impurity junction regions 221 and 231 may correspond to a portion of the P-type body 202.

The active region 205 that is, the P-type body 202 between the first and second impurity junction regions 221 and 231 may be divided into a first channel region 206, a second channel region 207 located between the first channel region 206 and the first impurity junction region 221, and a third channel region 208 located between the first channel region 206 and the second impurity junction region 231. Thus, one end of the second channel region 207 may be adjacent to a first end of the first channel region 206, and the other end of the second channel region 207 may be adjacent to a side of the first impurity junction region 221. Likewise, one end of the third channel region 208 may be adjacent to a second end of the first channel region 206, and the other end of the third channel region 208 may be adjacent to a side of the second impurity junction region 231.

A tunnel insulation layer 211 and the floating gate 212 may be sequentially stacked on the first channel region 206. The P-type body 202 including the first channel region 206, the tunnel insulation layer 211, and the floating gate 212 may constitute a MOS capacitor structure. Sidewalls and a top surface of the floating gate 212 may be covered with an insulation layer 260. The insulation layer 260 may laterally extend to cover the second and third channel regions 207 and 208.

The insulation layer 260 disposed on the sidewalls and the top surface of the floating gate 212 may serve as an inter-gate insulation layer. The insulation layer 260 disposed on the second channel region 207 may serve as a first gate insulation layer, and the insulation layer 260 disposed on the third channel region 208 may serve as a second gate insulation layer. The insulation layer 260 disposed on the second and third channel regions 207 and 208 may be thicker than the tunnel insulation layer 211. In some embodiments, a thickness of the insulation layer 260 disposed on the second and third channel regions 207 and 208 may be at least 1.5 times thicker than that of the tunnel insulation layer 211.

An interlayer insulation layer 270 may be disposed on the substrate 201 to cover the first and second impurity junction regions 221 and 231, the trench isolation layer 203 and the insulation layer 260. In some embodiments, the interlayer insulation layer 270 may be a single insulation layer. In another embodiment, the interlayer insulation layer 270 may be a multi-layered insulation layer including a plurality of insulation layers. The interlayer insulation layer 270 may have a first contact hole 271, a second contact hole 272 and a third contact hole 273. The first contact hole 271 may expose a portion of the first impurity junction region 221, and the second contact hole 272 may expose a portion of the second impurity junction region 231. The third contact hole 273 may expose a top surface of the insulation layer 260 that covers the sidewalls and the top surface of the floating gate 212 and extends onto the second and third channel regions 207 and 208.

The first contact hole 271 may be filled with a second contact plug 227, and the second contact hole 272 may be filled with a third contact plug 237. The third contact hole 273 may be filled with a first contact plug 217. Each of the first, second, and third contact plugs 217, 227 and 237 may include a metal material, for example, a tungsten material. The first contact plug 217 may overlap with the top surface and the sidewalls of the floating gate 212 and may also overlap with top surfaces of the second and third channel regions 207 and 208. Both sidewalls of the first contact plug 217 may be vertically self-aligned with a sidewall of the first impurity junction region 221 and a sidewall of the second impurity junction region 231, respectively. The second contact plug 227 may contact the first impurity junction region 221, and the third contact plug 237 may contact the second impurity junction region 231.

In the cross-sectional view of FIG. 8, the P-type body 202 including the first channel region 206, the floating gate 212, the insulation layer 260, and the first contact plug 217 may constitute a charge storage element 210 in a MOS capacitor structure. In the charge storage element 210, the first contact plug 217 may serve as a control gate, as described with reference to FIG. 7. Thus, when a certain voltage is applied to the first contact plug 217 through the word line WL, a coupling voltage may be induced at the floating gate 212. In such a case, the charge storage element 210 may have a high coupling ratio because the first contact plug 217 overlaps with the sidewalls and the top surface of the floating gate 212. Particularly if a thickness of the insulation layer 260 disposed between the floating gate 212 and the first contact plug 217 is reduced, the coupling ratio of the charge storage element 210 may increase.

The P-type body 202 including the second channel region 207, the first impurity junction region 221, the insulation layer 260 on the second channel region 207, and the first contact plug 217 may constitute the first selection transistor 220 in a half-MOS transistor structure. In the first selection transistor 220, the first contact plug 217 may serve as a first selection gate. The P-type body 202 including the third channel region 208, the second impurity junction region 231, the insulation layer 260 on the third channel region 208, and the first contact plug 217 may constitute the second selection transistor 230 in a half-MOS transistor structure. In the second selection transistor 230, the first contact plug 217 may serve as a second selection gate.

Figure 9:
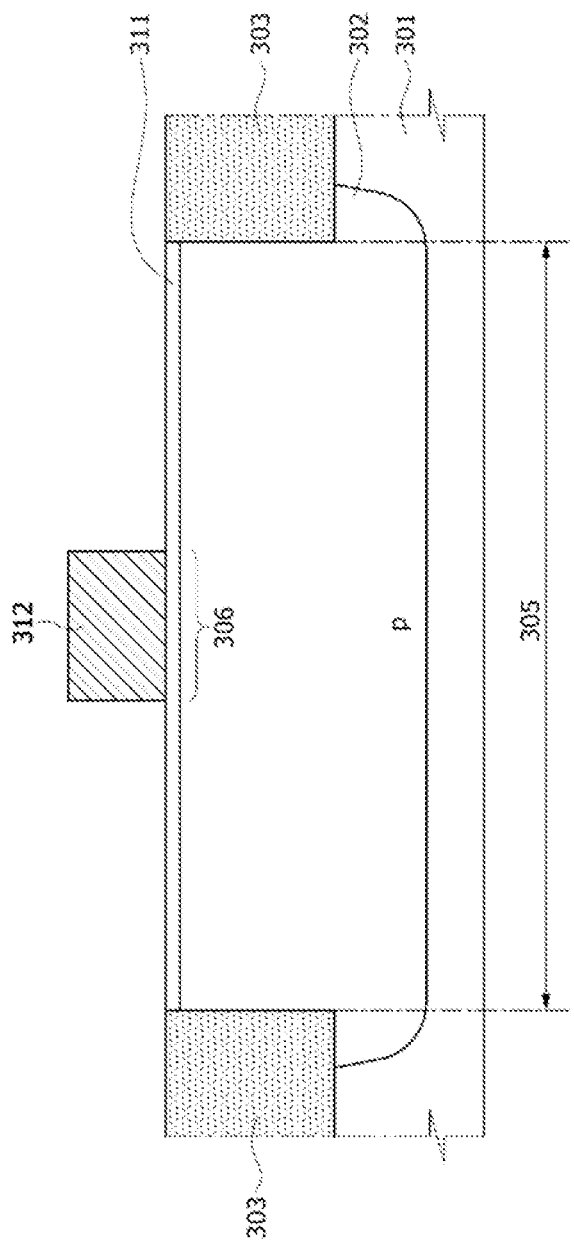
FIGS. 9 to 14 are cross-sectional views illustrating a method of fabricating a nonvolatile memory device according to an embodiment.

FIGS. 9 to 14 are cross-sectional views illustrating a method of fabricating a nonvolatile memory device according to an embodiment. Referring to FIG. 9, a P-type well region 302 may be formed in an upper region of a substrate 301. A trench isolation layer 303 may be formed in an isolation region of the substrate 301 to define an active region 305 in the P-type well region 302. A first insulation layer 311 may be formed on the active region 305. In some embodiments, the first insulation layer 311 may be formed of an oxide layer. A floating gate 312 may be formed on a portion of the first insulation layer 311. In some embodiments, the floating gate 312 may be formed of a polysilicon layer. An upper region of the P-type well region 302 vertically overlapping with the floating gate 312 may serve as a first channel region 306. A portion of the first insulation layer 311 disposed between the floating gate 312 and the first channel region 306 may serve as a tunnel insulation layer.

Figure 10:
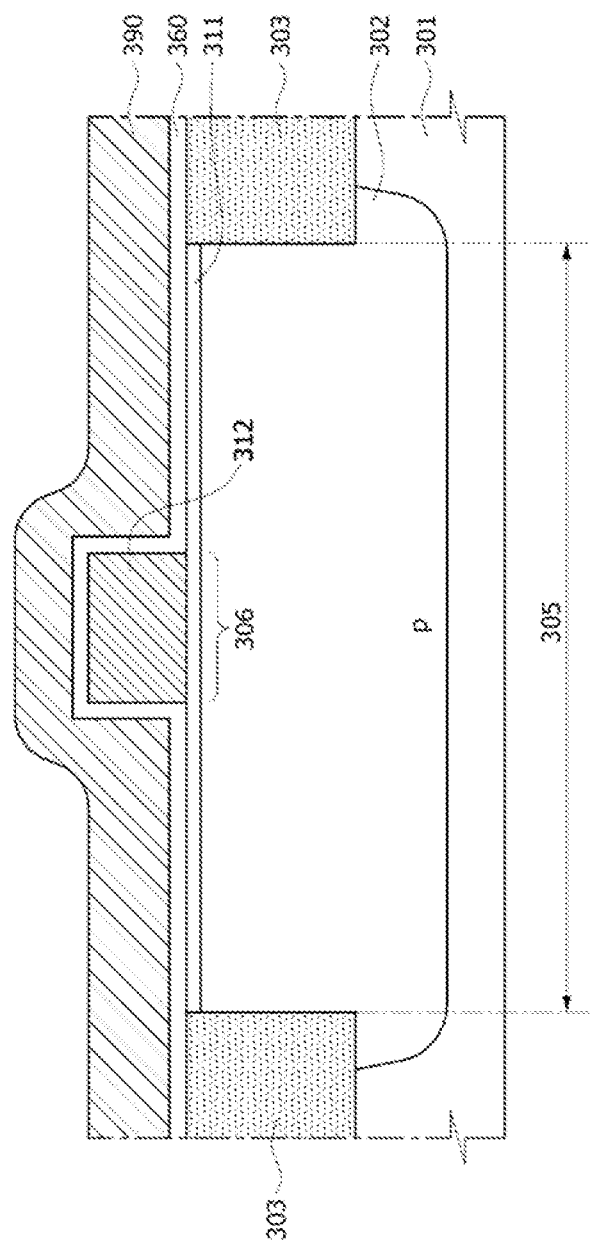

Referring to FIG. 10, a second insulation layer 360 may be formed on an entire surface of the substrate including the floating gate 312. In some embodiments, the second insulation layer 360 may be formed of an oxide layer. The second insulation layer 360 may be formed to cover sidewalls and a top surface of the floating gate 312 as well as a top surface of the first insulation layer 311. A spacer insulation layer 390 may be formed on the second insulation layer 360. In some embodiments, the spacer insulation layer 390 may be formed of a nitride layer.

Figure 11:
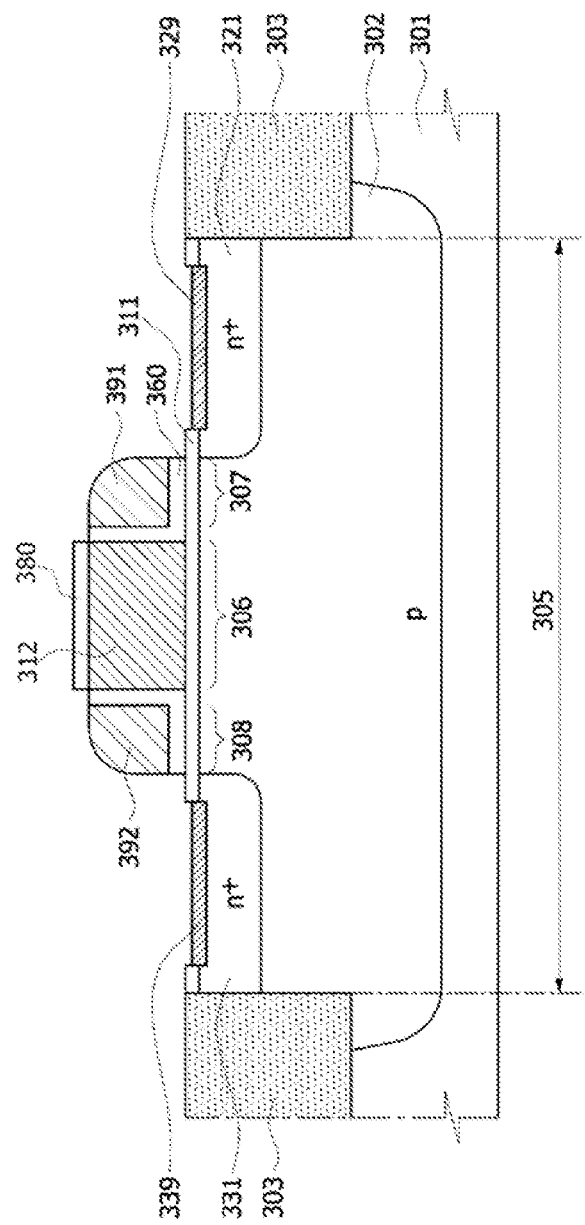

Referring to FIG. 11, the spacer insulation layer (390 of FIG. 10) and the second insulation layer 360 may be anisotropically etched until a top surface of the floating gate 312 is exposed. As a result, a first spacer 391 and a second spacer 392 may be respectively formed on both sidewalls of the floating gate 312, and portions of the second insulation layer 360 may remain between the first spacer 391 and the floating gate 312 as well as between the second spacer 392 and the floating gate 312. Each of the first and second spacers 391 and 392 may be formed to have a certain width in a horizontal direction which is parallel with a top surface of the substrate 301.

An upper region of the P-type well region 302 vertically overlapping with the first spacer 391 may be defined as a second channel region 307, and the first and second insulation layers 311 and 360 on the second channel region 307 may serve as a first gate insulation layer. An upper region of the P-type well region 302 vertically overlapping with the second spacer 392 may be defined as a third channel region 308, and the first and second insulation layers 311 and 360 on the third channel region 308 may serve as a second gate insulation layer.

N-type impurity ions may then be implanted into the active region 305 to form a first N-type impurity junction region 321 and a second N-type impurity junction region 331 in both upper ends of the active region 305, respectively. During the ion implantation process for forming the first and second impurity junction regions 321 and 331, the first and second spacers 391 and 392 and the floating gate 312 may serve as ion implantation masks. Thus, one end of the first impurity junction region 321 may be self-aligned with an outer sidewall of the first spacer 391, and one end of the second impurity junction region 331 may be self-aligned with an outer sidewall of the second spacer 392.

After exposing top surfaces of the first and second impurity junction regions 321 and 331, a first metal silicide layer 329 and a second metal silicide layer 339 may be formed on the exposed first and second impurity junction regions 321 and 331, respectively. Before exposing the top surfaces of the first and second impurity junction regions 321 and 331, a third insulation layer 380 may be formed on the top surface of the floating gate 312 to prevent silicidation of the floating gate 312 while the first and second metal silicide layers 329 and 339 are formed.

Figure 12:
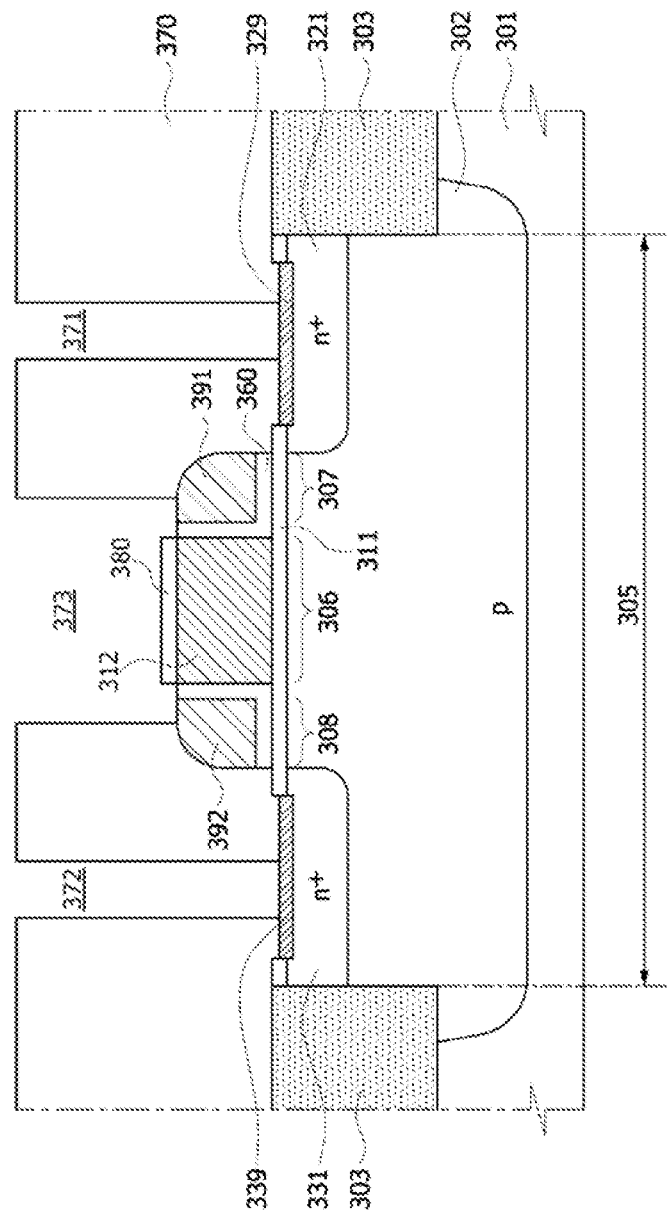

Referring to FIG. 12, an interlayer insulation layer 370 may be formed on an entire surface of the substrate including the first and second metal silicide layers 329 and 339. The interlayer insulation layer 370 may be formed of a single insulation layer of an oxide material. Alternatively, the interlayer insulation layer 370 may be formed of a multi-layered insulation layer including a plurality of insulation layers. The interlayer insulation layer 370 may be patterned to form a first contact hole 371 exposing the first metal silicide layer 329, a second contact hole 372 exposing the second metal silicide layer 339, and a third contact hole 373 exposing the third insulation layer 380 and the first and second spacers 391 and 392. The interlayer insulation layer 370 may be patterned using a mask pattern, for example, a photoresist pattern.

Figure 13:
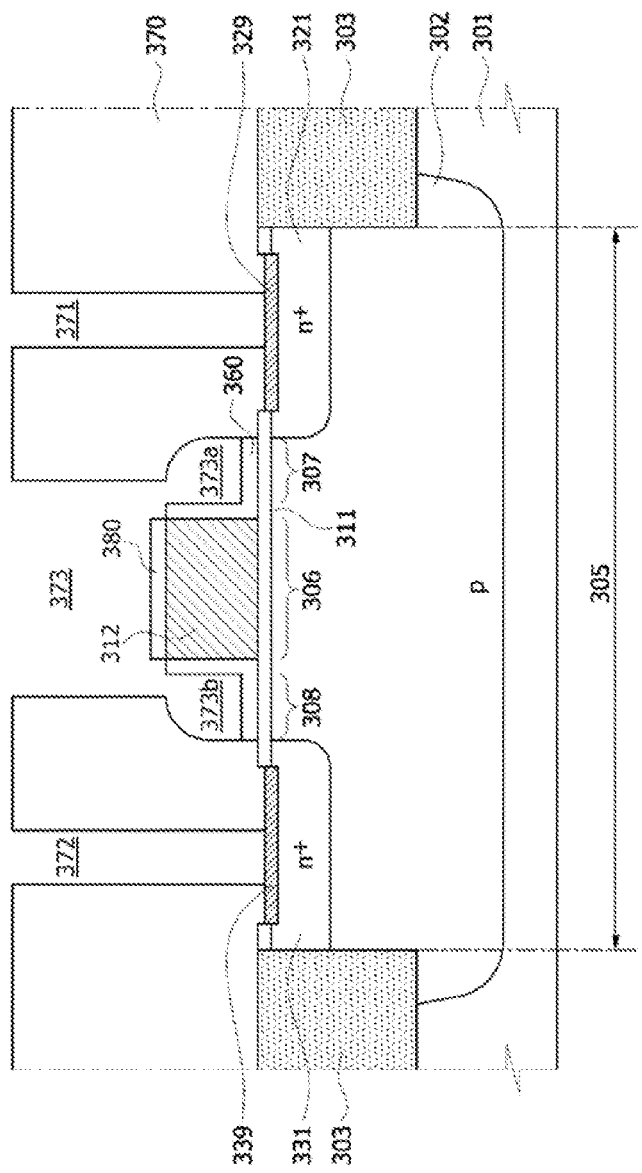

Referring to FIG. 13, the first and second spacers (391 and 392 of FIG. 12) exposed by the third contact hole 373 may be removed. The first and second spacers (391 and 392 of FIG. 12) may be removed using a wet etch process that is performed with an etchant for selectively removing a material of the first and second spacers (391 and 392 of FIG. 12). For example, if the second and third insulation layers 360 and 380 are formed of an oxide layer and the first and second spacers 391 and 392 are formed of a nitride layer, the wet etch process for selectively removing the first and second spacers 391 and 392 may be performed using a phosphoric acid solution as an etchant. As a result, the first and second spacers 391 and 392 are removed to provide an empty space 373a and an empty space 373b, respectively. Accordingly, the third contact hole 373 may be expanded to include the spaces 373a and 373. The empty spaces 373a and 373b may expose the second insulation layer 360 that remains on the sidewalls of the floating gate 312 and on the second and third channel regions 307 and 308.

Figure 14:
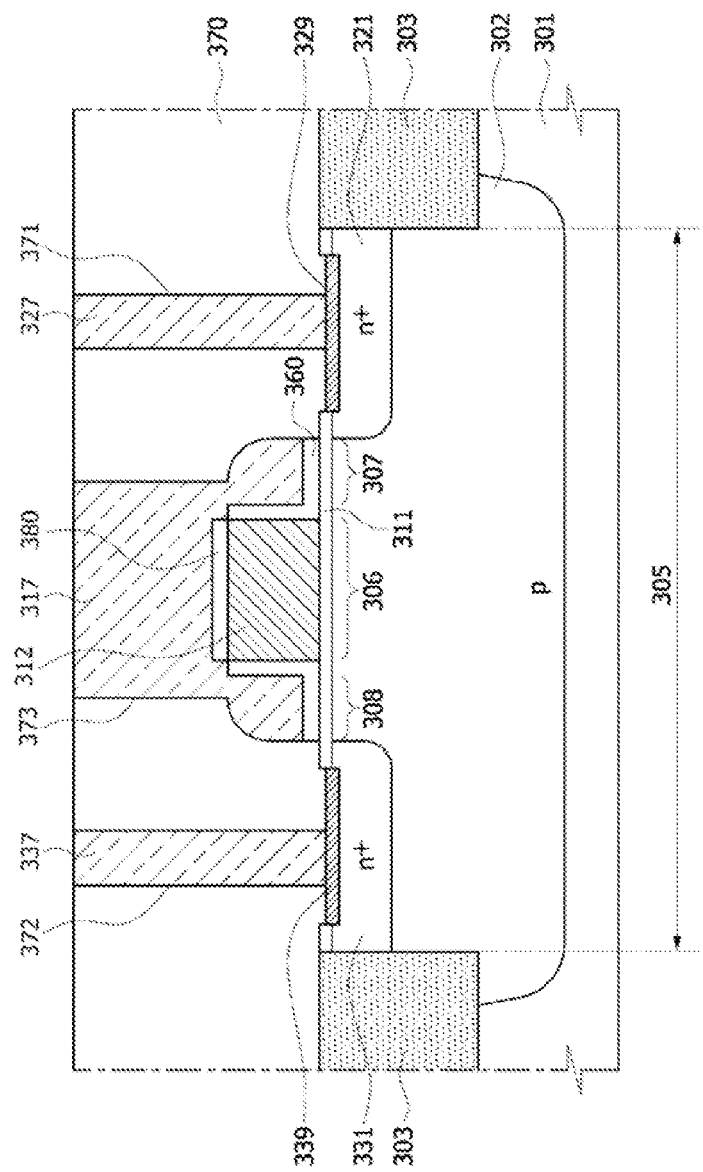

Referring to FIG. 14, a metal layer may be formed to fill the first, second and third contact holes 371, 372 and 373. As a result, a first contact plug 317 may be formed in the third contact hole 373, and second and third contact plugs 327 and 337 may be respectively formed in the first and second contact holes 371 and 372. In some embodiments, the first, the second, and the third contact plugs 317, 327 and 337 may be formed of the same metal layer, for example, a tungsten (W) layer. In some other embodiments, each of the first, second and third contact plugs 317, 327 and 337 may include a plurality of metal layers.

Figure 15:
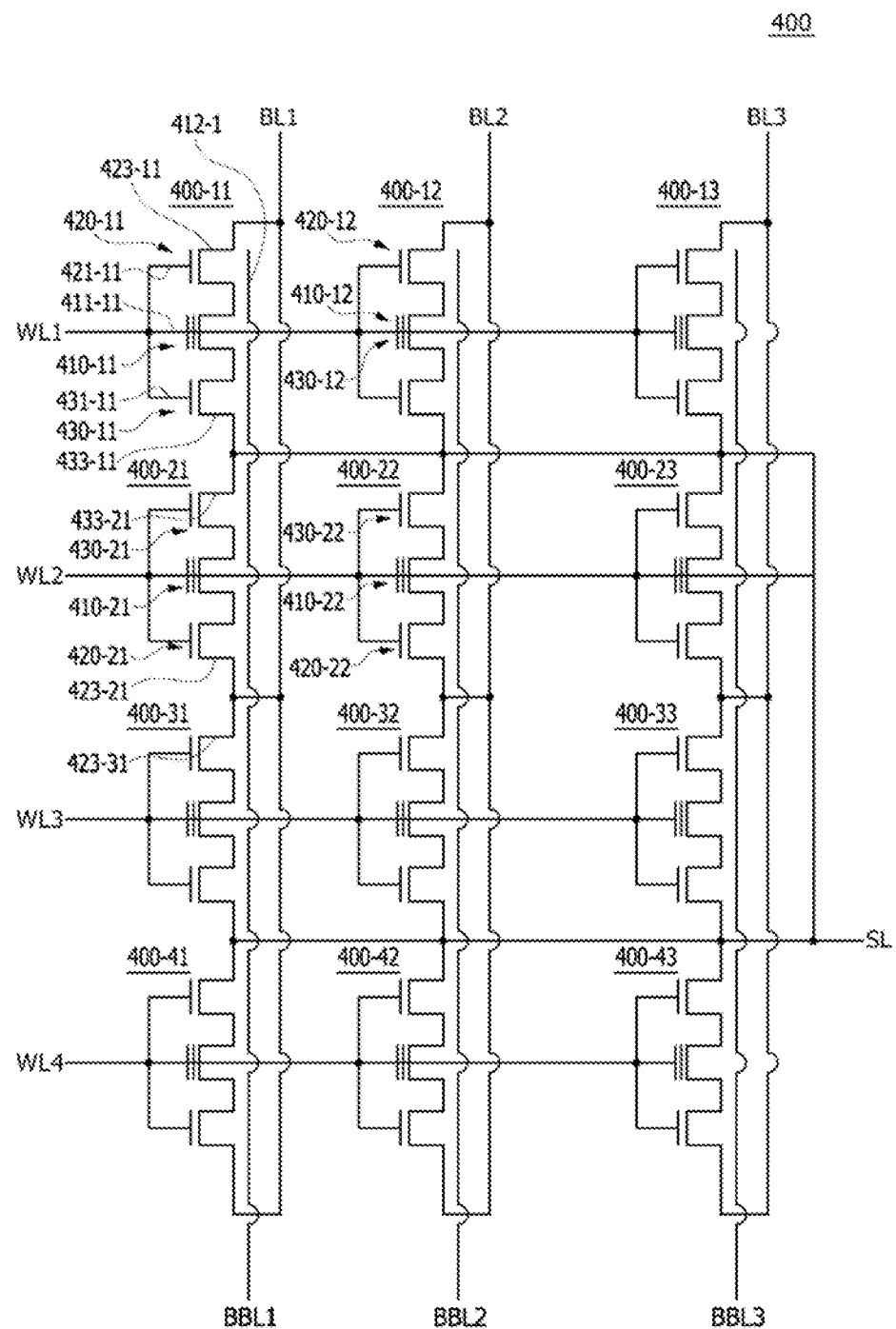
FIG. 15 is an equivalent circuit diagram illustrating a nonvolatile memory cell array according to an embodiment.

FIG. 15 is an equivalent circuit diagram illustrating a nonvolatile memory cell array 400 according to an embodiment. Referring to FIG. 15, the nonvolatile memory cell array 400 may include a plurality of unit cells which are arrayed in rows and columns to have a 4×3 matrix form. The number of the rows and the number of the columns of the nonvolatile memory cell array 400 may be set differently from each other according to embodiments.

In an embodiment, the rows and the columns may be defined arbitrarily. For example, even though word lines are respectively disposed in rows in some embodiments, in other embodiments the word lines may be respectively disposed in columns. Similarly, even though a single page is configured to include unit cells arrayed in a single row parallel with word lines in some embodiments, in other embodiments the single page may be configured to include unit cells arrayed in a single column parallel with bit lines.

Each of the unit cells included in the nonvolatile memory cell array 400 may have the same configuration as the unit cell 100 described with reference to FIG. 1. For example, a unit cell 400-11 located at a cross point of a first row and a first column may include a charge storage element 410-11, a first selection transistor 420-11, and a second selection transistor 430-11.

The charge storage element 410-1 may have a control gate terminal 411-11 connected to a first word WL1 and a body terminal 412-1 connected to a first body bias line BBL1. The first selection transistor 420-11 may have a first selection gate terminal 421-11 connected to the first word line WL1 and a first impurity junction terminal 423-11 connected to a first bit line BL1. The second selection transistor 430-11 may have a second selection gate terminal 431-11 connected to the first word line WL1 and a second impurity junction terminal 433-11 connected to a source line SL.

A unit cell 400-12 located at a cross point of the first row and a second column may share the first word line WL1 with the unit cell 400-11. The unit cell 400-12 may include a charge storage element 410-12, a first selection transistor 420-12 and a second selection transistor 430-12. A unit cell 400-21 located at a cross point of a second row and the first column may share the first bit line BL1 and the first body bias line BBL1 with the unit cell 400-11.

The unit cell 400-21 may include a charge storage element 410-21, a first selection transistor 420-21 and a second selection transistor 430-21. A unit cell 400-22 located at a cross point of the second row and the second column does not share any of the first word line WL1, the first bit line BL1 and the first body bias line BBL1 with the unit cell 400-11. The unit cell 400-22 may include a charge storage element 410-22, a first selection transistor 420-22 and a second selection transistor 430-22.

The unit cell 400-11, the unit cell 400-12 and a unit cell 400-arrayed in the first row may share the first word line WL1 with each other. The unit cell 400-21, the unit cell 400-22 and a unit cell 400-23 arrayed in the second row may share a second word line WL2 with each other. A unit cell 400-31, a unit cell 400-32 and a unit cell 400-33 arrayed in a third row may share a third word line WL3 with each other.

A unit cell 400-41, a unit cell 400-42 and a unit cell 400-43 arrayed in a fourth row may share a fourth word line WL4 with each other.

The unit cells 400-11, 400-21, 400-31 and 400-41 arrayed in the first column may share the first bit line BL1 and the first body bias line BBL1 with each other. The unit cells 400-12, 400-22, 400-32 and 400-42 arrayed in the second column may share a second bit line BL2 and a second body bias line BBL2 with each other. The unit cells 400-13, 400-23, 400-33 and 400-43 arrayed in a third column may share a third bit line BL3 and a third body bias line BBL3 with each other. All of the unit cells may share the source line SL with each other.

Here, "N" is an odd number. A second impurity junction terminal of a first unit cell located at a cross point of an $N^{th}$ row and a predetermined column may be directly connected to a second impurity junction terminal of a second unit cell located at a cross point of an $(N+1)^{th}$ row and the predetermined column and the second impurity junction terminals of the first and second unit cells may be connected to the source line SL. Thus, the first unit cell and the second unit cell may be arrayed symmetrically with respect to their common contact point which is connected to the source line SL. For example, the second impurity junction terminal 433-11 of the unit cell 400-11 located at a cross point of the first row and the first column may be connected to the second impurity junction terminal 433-21 of the unit cell 400-21 located at a cross point of the second row and the first column. The unit cells 400-11 and 400-21 may be symmetric with respect to their contact point connected to the source line SL.

In addition, a first impurity junction terminal of the first unit cell located at a cross point of the $N^{th}$ row and the predetermined column may be directly connected to a first impurity junction terminal of a third unit cell located at a cross point of an $(N-1)^{th}$ row and the predetermined column and the first impurity junction terminals of the first and third unit cells may be connected to one of the bit lines BL1~BL3. Thus, the first unit cell and the third unit cell may be arrayed to be symmetric with respect to their contact point connected to one of the bit lines BL1~BL3.

For example, a first impurity junction terminal 423-31 of the unit cell 400-31 located at a cross point of the third row and the first column may be connected to the first impurity junction terminal 423-21 of the unit cell 400-21 located at a cross point of the second row and the first column, and the unit cells 400-31 an 400-21 may be symmetric with respect to their contact point connected to the first bit line BL1.

Figure 16:
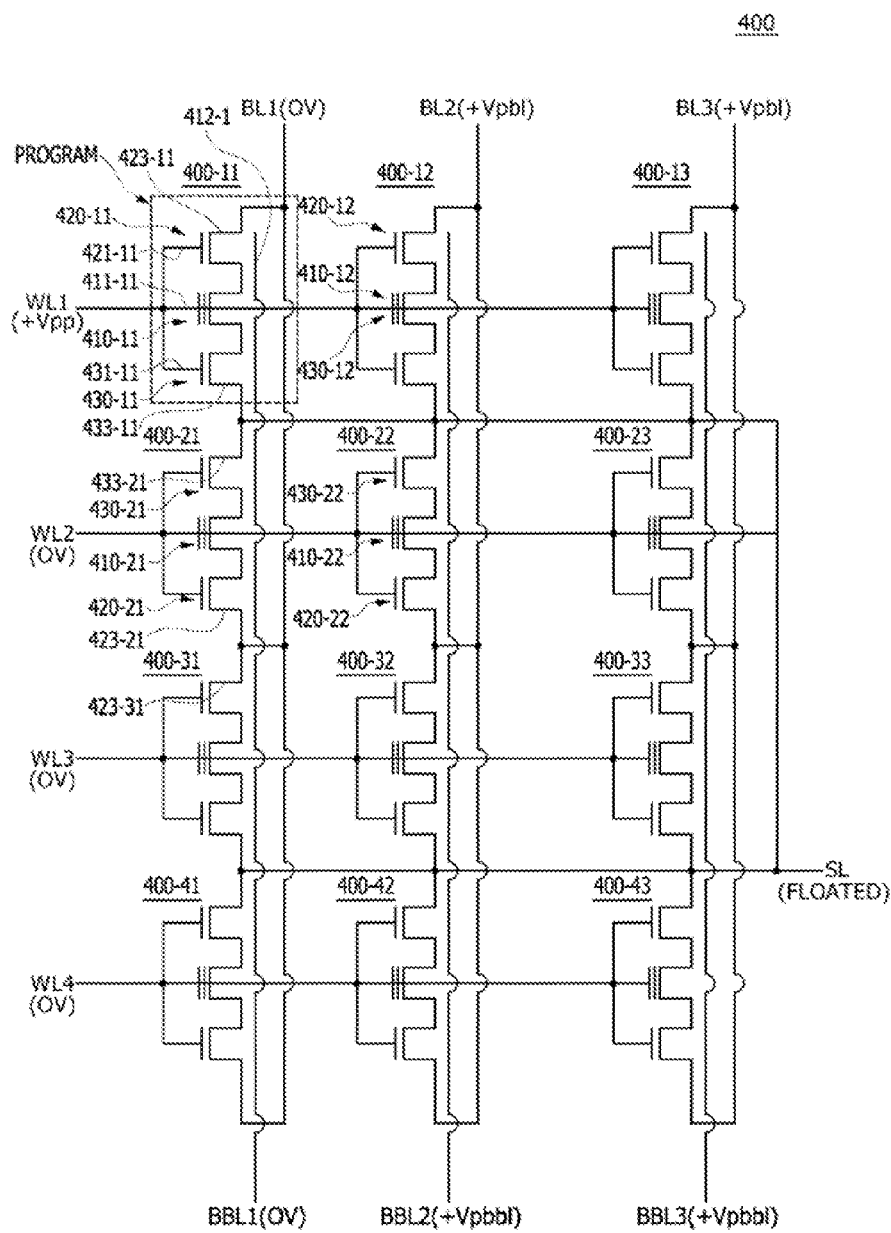
FIG. 16 is an equivalent circuit diagram illustrating a program operation of the nonvolatile memory cell array shown in FIG. 15.

FIG. 15 is an equivalent circuit diagram illustrating a program operation of the nonvolatile memory cell array 400 shown in FIG. 15. In FIG. 16, the same reference numerals or characters as used in FIG. 15 denote the same elements. The program operation illustrated in FIG. 16 will be described in conjunction with an example in which the unit cell 400-11 hereinafter, referred to as a selected unit cell, located at a cross point of the first row and the first column is selectively programmed. The program operation illustrated in FIG. 16 may be equally applied to a method of programming any one of the other unit cells.

Referring to FIG. 16, a positive program voltage +Vpp may be applied to the first word line WL1 connected to the selected unit cell 400-11, and the remaining word lines WL2, WL3 and WL4 may be grounded. The first bit line BL1 and the first body bias line BBL1 connected to the selected unit cell 400-11 may also be grounded, and a positive program bit line voltage +Vpbl may be applied to the remaining bit lines BL2 and BL3. In addition, a positive program body voltage +Vpbbl may be applied to the remaining body bias lines BBL2 and BBL3, and the source line SL may be floated.

The positive program voltage +Vpp may have a voltage level which is capable of causing an F-N tunneling phenomenon that electrons in a grounded body of the charge storage element 410-11 are injected into the floating gate of the charge storage element 410-11 due to a coupling voltage induced at the floating gate of the charge storage element 410-11 by the positive program voltage +Vpp. The positive program body voltage +Vpbbl may be lower than a coupling voltage induced at the floating gate of the charge storage element 410-11 by the positive program voltage +Vpp. The positive program body voltage +Vpbbl may be set so that electrons in a body having the positive program body voltage +Vpbbl are not injected into a floating gate having a coupling voltage by an F-N tunneling mechanism.

Figure 17:
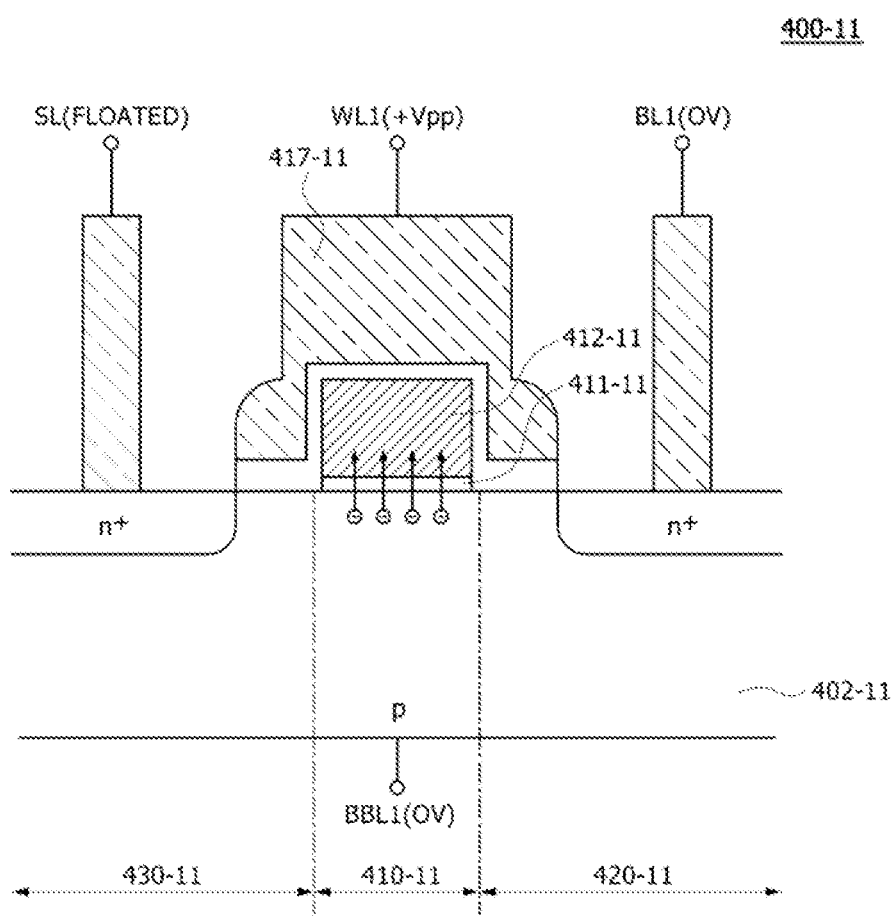
FIG. 17 is a cross-sectional view illustrating a program operation of a selected unit cell of the nonvolatile memory cell array shown in FIG. 16.

FIG. 17 is a cross-sectional view illustrating a program operation of the selected unit cell 400-11 of the nonvolatile memory cell array 400 shown in FIG. 15. As illustrated in FIG. 17, the positive program voltage +Vpp may be applied to a first contact plug 417-11 of the selected unit cell 400-11 through the first word line WL1, and a body 402-11 of the selected unit cell 400-11 may be grounded. As shown in FIG. 17, a certain coupling voltage may be induced at a floating gate 412-11 of the charge storage element 410-11 and a vertical electric field may be created between the floating gate 41241 at which the coupling voltage is induced and the body 402-11 to which a ground voltage is applied. Electrons in the body 402-11 may be injected into the floating gate 412-11 through a tunnel insulation layer 411-11 by an F-N tunneling mechanism due to the vertical electric field created between the floating gate 412-11 and the body 402-11, as indicated by arrows. As a result, the selected unit cell 400-11 may be programmed.

While the selected unit cell 400-11 is programmed, a channel inversion layer may be formed in each of the first and second selection transistors 420-11 and 430-11 due to the positive program voltage +Vpp applied to the first word line WL1. However, the channel inversion layers formed in the first and second selection transistors 420-11 and 430-11 do not affect the program operation of the selected unit cell 400-11 that is, the charge storage element 410-11.

Figure 18:
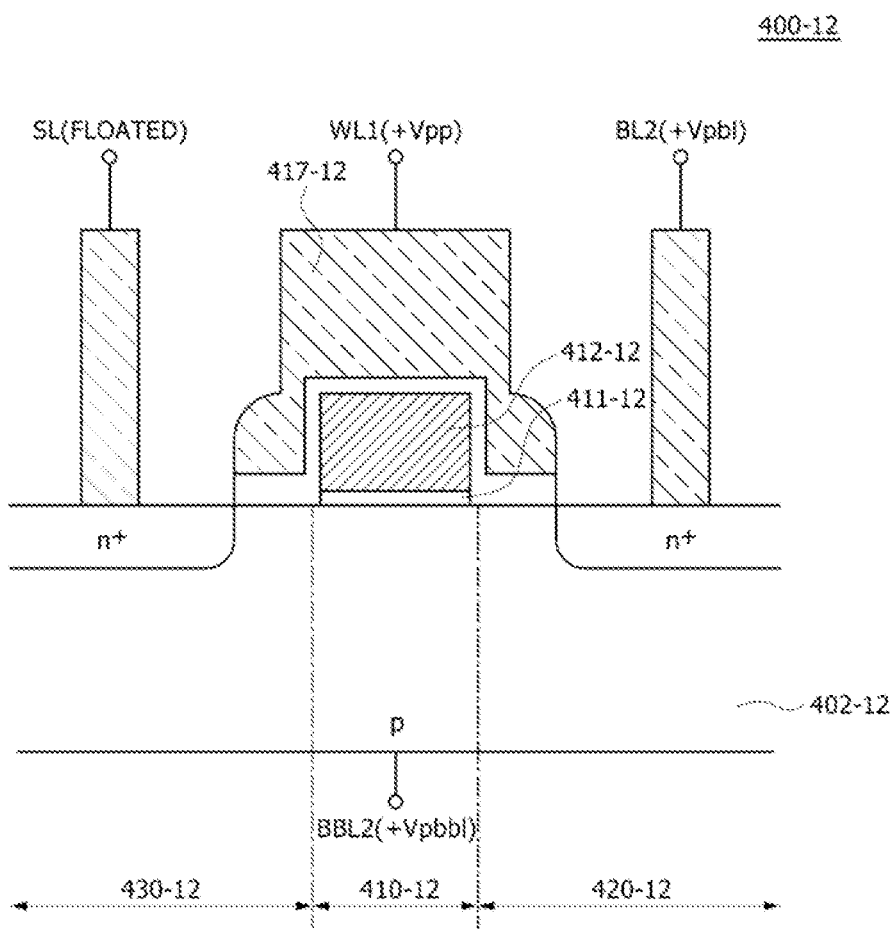
FIG. 18 is a cross-sectional view illustrating a program inhibition operation of a non-selected unit cell sharing a first word line with a selected unit cell of the nonvolatile memory cell array shown in FIG. 16.

FIG. 18 is a cross-sectional view illustrating a program inhibition operation of a non-selected unit cell 400-12 sharing the first word line WL with the selected unit cell 400-11 of the nonvolatile memory cell array 400 shown in FIG. 15. As illustrated in FIG. 18, in the non-selected unit cell 400-12 sharing the first word line WL with the selected unit cell 400-11, the positive program voltage +Vpp may be applied to a first contact plug 417-12 of the non-selected unit cell 400-12 through the first word line WL1. Accordingly, a certain coupling voltage may be induced at a floating gate 412-12 of a charge storage element 410-12 of the non-selected unit cell 400-12. A vertical electric field may be created between the floating gate 412-12 at which the coupling voltage is induced and a body 402-12 to which the positive program body voltage +Vpbbl is applied.

As described with reference to FIG. 16, the positive program body voltage +Vpbbl has a voltage level that does not cause an F-N tunneling phenomenon so that electrons in the body 402-12 are injected into the floating gate 412-12. Thus, while the selected unit cell 400-11 is programmed, the electrons in the body 402-12 are not injected into the floating gate 412-12 of the charge storage element 410-12 through a tunnel insulation layer 411-12 by an F-N tunneling mechanism.

As a result, a program operation of the non-selected unit cell 400-12 may be prohibited. While the selected unit cell 400-11 is programmed, a channel inversion layer may be formed in each of first and second selection transistors 420-12 and 430-12 due to the positive program voltage +Vpp applied to the first word line WL1. However, the channel inversion layers formed in the first and second selection transistors 420-12 and 430-12 do not affect the program operation of the selected unit cell 400-11 since program inhibition operation occurs in the charge storage element 410-12 of the non-selected unit cell 400-12 due to the positive program body voltage +Vpbbl which has substantially the same voltage level as the positive program bit line voltage +Vpbl applied to the second bit lines BL2. Program operations of the remaining non-selected unit cells sharing the first word line WL1 with the selected unit cell 400-11 may also be prohibited by the same mechanism as the program inhibition operation of the non-selected unit cell 400-12.

Figure 19:
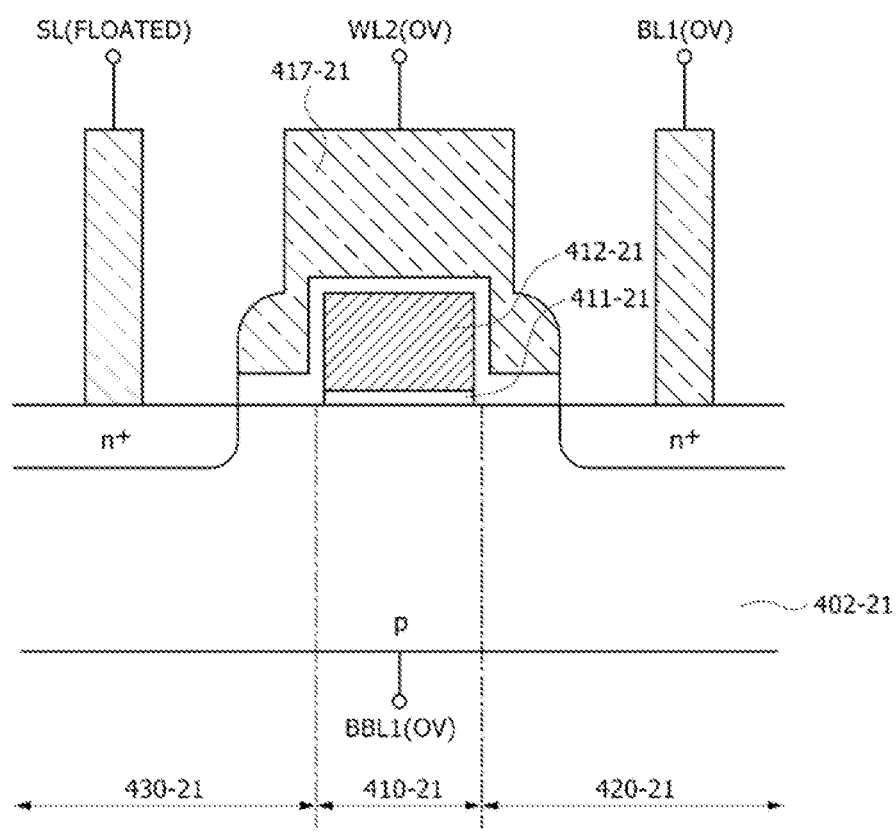
FIG. 19 is a cross-sectional view illustrating a program inhibition operation of a non-selected unit cell sharing a first bit line and a first body bias line with a selected unit cell of the nonvolatile memory cell array shown in FIG. 16.

FIG. 19 is a cross-sectional view illustrating a program inhibition operation of a non-selected unit cell 400-21 sharing the first bit line BL1 and the first body bias line BBL1 with the selected unit cell 400-11 of the nonvolatile memory cell array 400 shown in FIG. 16. As illustrated in FIG. 19, in the non-selected unit cell 400-21 sharing the first bit line BL1 and the first body bias line BBL1 with the selected unit cell 400-11, a ground voltage may be applied to a first contact plug 417-21 of the non-selected unit cell 400-21 through the second word line WL2. A body 402-21 connected to the first body bias line BBL1 may also be grounded.

Under this bias condition, a ground voltage may be induced at a floating gate 412-21 of a charge storage element 410-21 of the non-selected unit cell 400-21. That is, no vertical electrical field is created between the floating gate 412-21 and the body 402-21. Thus, while the selected unit cell 400-11 is programmed, the electrons in the body 402-21 are not injected into the floating gate 412-21 of the charge storage element 410-21 through a tunnel insulation layer 411-21 by an F-N tunneling mechanism. As a result, a program operation of the non-selected unit cell 400-21 may be prohibited.

While the selected unit cell 400-11 is programmed, first and second selection transistors 420-21 and 430-21 of the non-selected unit cell 400-21 may be turned off due to a ground voltage applied to the second word line WL2. Program operations of the remaining non-selected unit cells sharing the first bit line. BL1 and the first body bias line BBL with the selected unit cell 400-11 may also be prohibited by the same mechanism as the program inhibition operation of the non-selected unit cell 400-21.

Figure 20:
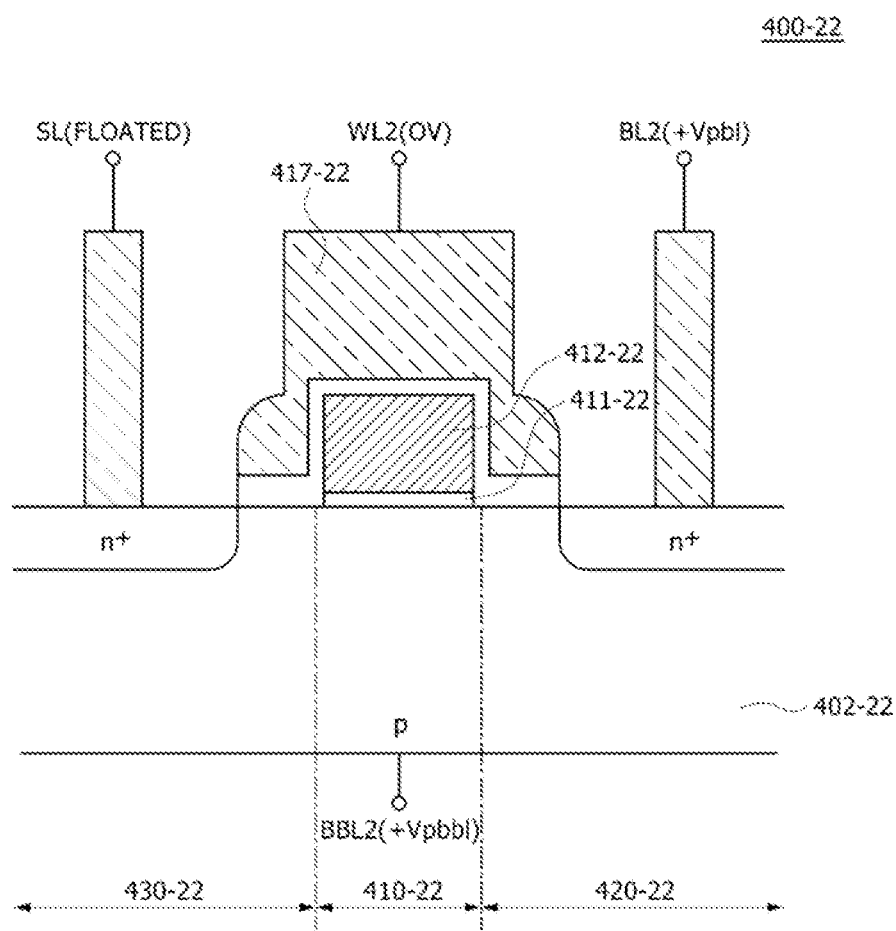
FIG. 20 is a cross-sectional view illustrating a program inhibition operation of a non-selected unit cell that does not share any word line, any bit line, or any body bias line with a selected unit cell of the nonvolatile memory cell array shown in FIG. 16.

FIG. 20 is a cross-sectional view illustrating a program inhibition operation of a non-selected unit cell 400-22 that does not share any word lines, any bit lines, and any body bias lines with the selected unit cell 400-11 of the nonvolatile memory cell array 400 shown in FIG. 16. As illustrated in FIG. 20, in the non-selected unit cell 400-22 that does not share any word lines, any bit lines, and any body bias lines with the selected unit cell 400-11, a ground voltage may be applied to a first contact plug 417-22 of the non-selected unit cell 400-22 through the second word line WL2 and the positive program body voltage +Vpbbl may be applied to a body 402-22 connected to the second body bias line BBL2. If a charge storage element 410-22 of the non-selected unit cell 400-22 has a high coupling ratio close to "1", a coupling voltage close to a ground voltage may be induced at a floating gate 412-22 of the charge storage element 410-22.

A vertical electric field may be created between the floating gate 412-22 at which the coupling voltage close to a ground voltage is induced, and the body 402-22 to which the positive program body voltage +Vpbbl is applied.

As described with reference to FIG. 16, the positive program body voltage +Vpbbl has a voltage level that does not cause an F-N tunneling phenomenon so that electrons in the body 402-22 are injected into the floating gate 412-22. Thus, while the selected unit cell 400-11 is programmed, the electrons in the body 402-22 are not injected into the floating gate 412-22 through a tunnel insulation layer 411-22 by an F-N tunneling mechanism. As a result, a program operation of the non-selected unit cell 400-22 may be prohibited.

While the selected unit cell 400-11 is programmed, first and second selection transistors 420-22 and 430-22 of the non-selected unit cell 400-22 may be turned off due to a ground voltage applied to the second word line WL2. Program operations of the remaining non-selected unit cells that do not share any word lines, any bit lines, and any body bias lines with the selected unit cell 400-11 may also be prohibited by the same mechanism as the program inhibition operation of the non-selected unit cell 400-22.

Figure 21:
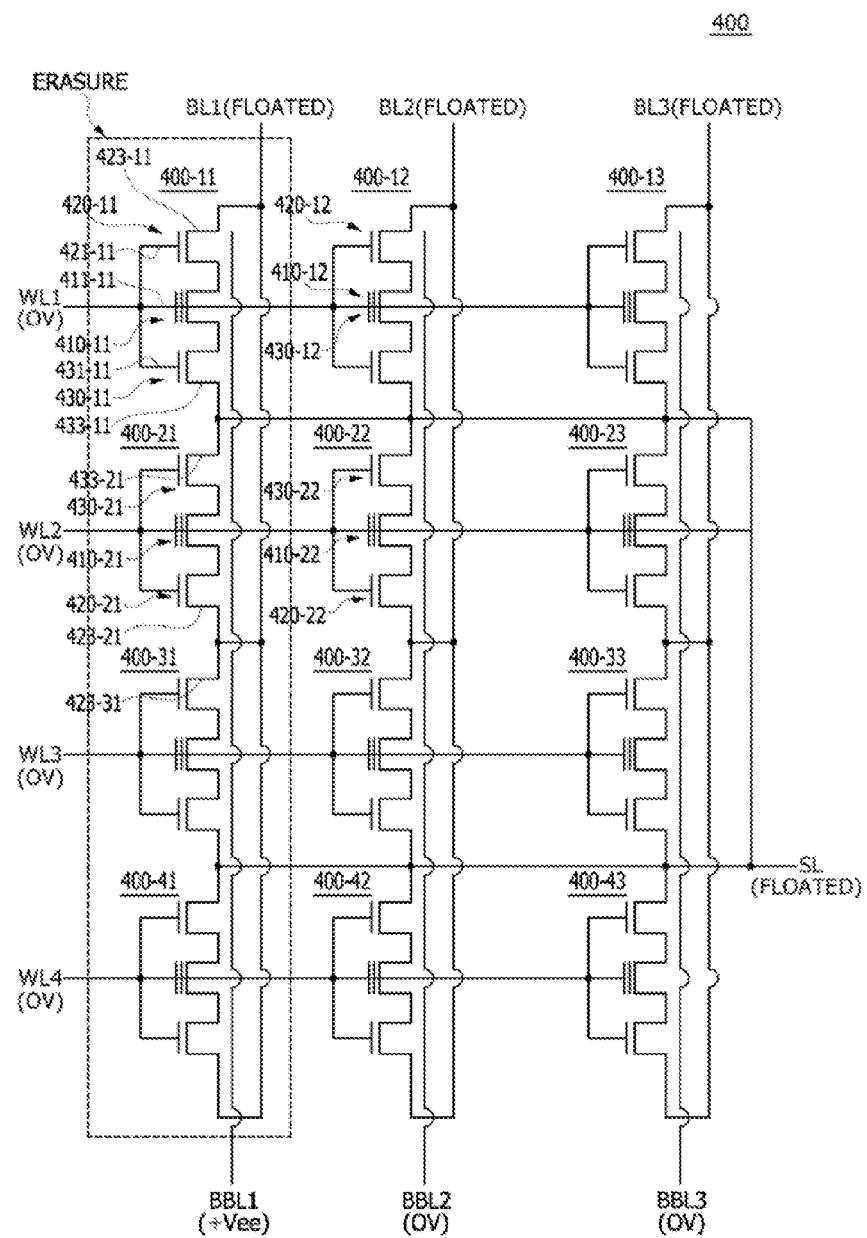
FIG. 21 is an equivalent circuit diagram illustrating an erasure operation of the nonvolatile memory cell array shown in FIG. 15.

FIG. 21 is an equivalent circuit diagram illustrating an erasure operation of the nonvolatile memory cell array 400 shown in FIG. 15. In FIG. 21, the same reference numerals or characters as used in FIG. 15 denote the same elements. The erasure operation illustrated in FIG. 21 may be executed to selectively erase only some of the unit cells of the nonvolatile memory cell array 400. For example, the erasure operation illustrated in FIG. 21 may be executed to erase the nonvolatile memory cell array 400 page by page. A plurality of unit cells sharing a bit line and a body bias line with each other may define a single page, and the erasure operation may be executed by unit of page. In an embodiment, the erasure operation may be executed to erase only a single page at a time. See FIG. 23 which will be described below. In another embodiment, the erasure operation may be executed to erase a plurality of pages at a time. See FIGS. 24 and 25 which will be described below.

Referring to FIG. 21, to erase a plurality of unit cells such as, the unit cells 400-11, 400-21, 400-31 and 400-41 arrayed in the first column, sharing the first bit line BL1 and the first body bias line BBL1 with each other, all of the word lines WL1~WL4 may be grounded and all of the bit lines BL1~BL3 and the source line SL may be floated. A positive erasure voltage +Vee may be applied to the first body bias line BBL1 connected to a selected page which will be erased, and the remaining body bias lines BBL2 and BBL3 may be grounded.

Figure 22:
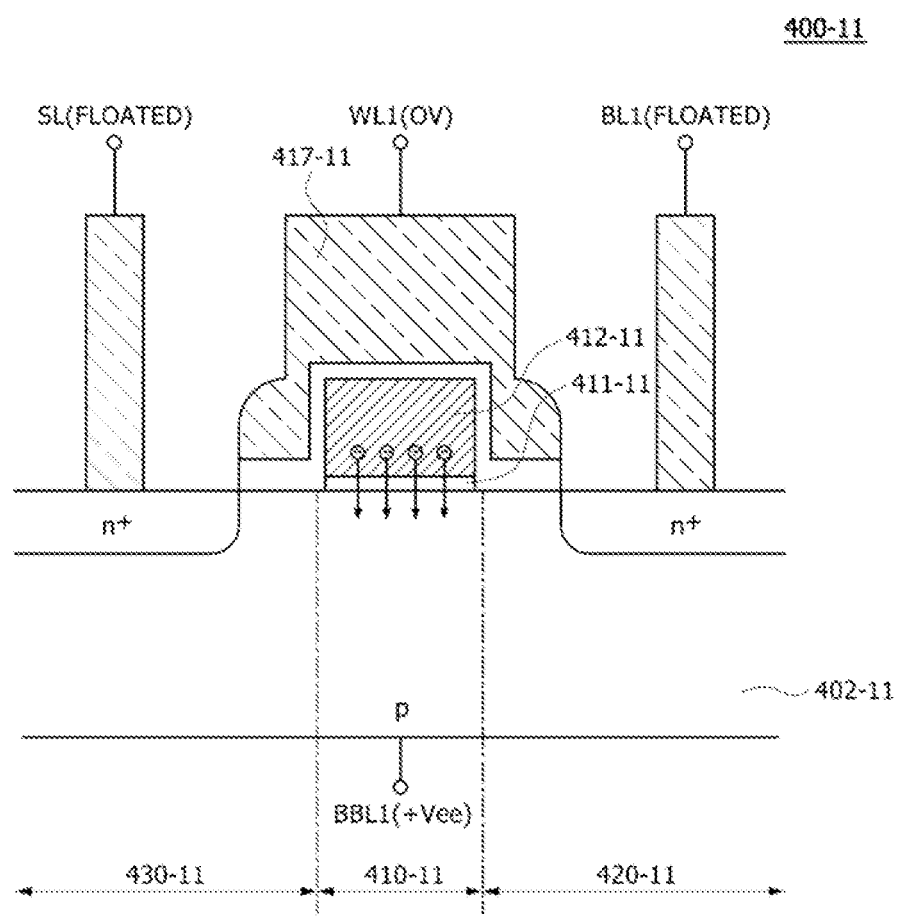
FIG. 22 is a cross-sectional view illustrating an erasure operation of a selected unit cell of the nonvolatile memory cell array shown in FIG. 21.

FIG. 22 is a cross-sectional view illustrating an erasure operation of the selected unit cell 400-11 included in the selected page of the nonvolatile memory cell array 400 shown in FIG. 21. Referring to FIG. 22, a ground voltage may be applied to the first contact plug 417-11 of the selected unit cell 400-11 of the selected page through the first word line WL1 and the positive erasure voltage +Vee may be applied to the body 402-11 of the selected unit cell 400-11 through the first body bias line BBL1.

Thus, a certain coupling voltage between a ground voltage and the positive erasure voltage +Vee may be induced at the floating gate 412-11 of the charge storage element 410-11, and a vertical electric field may be created between the floating gate 412-11 at which the coupling voltage is induced and the body 402-11 to which the positive erasure voltage +Vee is applied. Electrons in the floating gate 412-11 may be injected into the body 402-11 through the tunnel insulation layer 411-11 by an F-N tunneling mechanism due to the vertical electric field created between the floating gate 412-11 and the body 402-11, as indicated by arrows.

As a result, the selected unit cell 400-11 may be erased. While the selected unit cell 400-11 is erased, the first and second transistors 420-11 and 430-11 may be turned off since the first word line WL1 is grounded. The remaining selected unit cells that is, the unit cells 400-21, 400-31 and 400-41, included in the selected page may also be erased by the same mechanism as the erasure operation of the selected unit cell 400-11.

Figure 23:
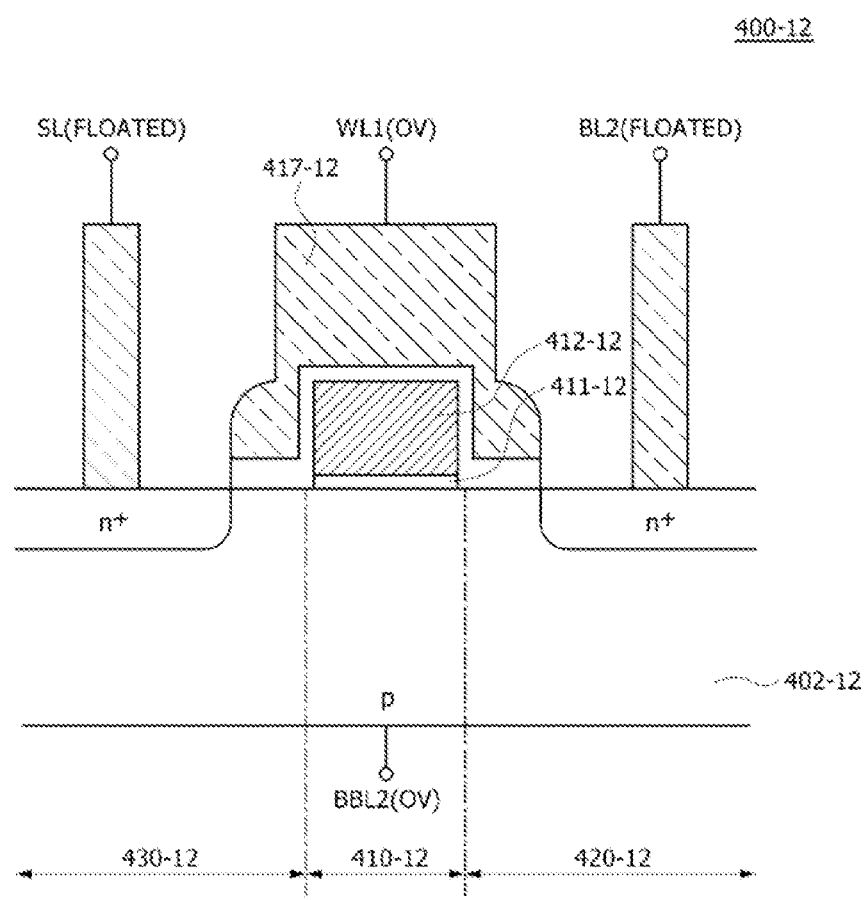
FIG. 23 is a cross-sectional view illustrating an erasure inhibition operation of a non-selected unit cell of the non-volatile memory cell array shown in FIG. 21.

FIG. 23 is a cross-sectional view illustrating an erasure inhibition operation of the non-selected unit cell 400-12 of the nonvolatile memory cell array 400 shown in FIG. 21. Referring to FIG. 23, a ground voltage may be applied to the first contact plug 417-12 of the non-selected unit cell 400-12 included in a non-selected page through the first word line WL1, and a ground voltage may also be applied to the body 402-12 of the non-selected unit cell 400-12 through the second body bias line BBL2.

Thus, a certain coupling voltage, that is, a ground voltage may be induced at the floating gate 412-12 of the charge storage element 410-12, and no vertical electric field may be created between the floating gate 412-12 at which a ground voltage is induced and the body 402-12 to which a ground voltage is applied. Accordingly, while the selected page including the selected unit cell 400-11 is erased, the electrons in the floating gate 412-12 are not injected into the body 402-12 through the tunnel insulation layer 411-12 by an F-N tunneling mechanism.

As a result, an erasure operation of the non-selected unit cell 400-12 may be prohibited. While the selected page including the selected unit cell 400-11 is erased, the first and second selection transistors 420-12 and 430-12 of the non-selected unit cell 400-12 may be turned off due to a ground voltage applied to the first word line WL1. Erasure operations of the remaining non-selected unit cells included in non-selected pages may also be prohibited by the same mechanism as the erasure inhibition operation of the non-selected unit cell 400-12.

Figure 24:
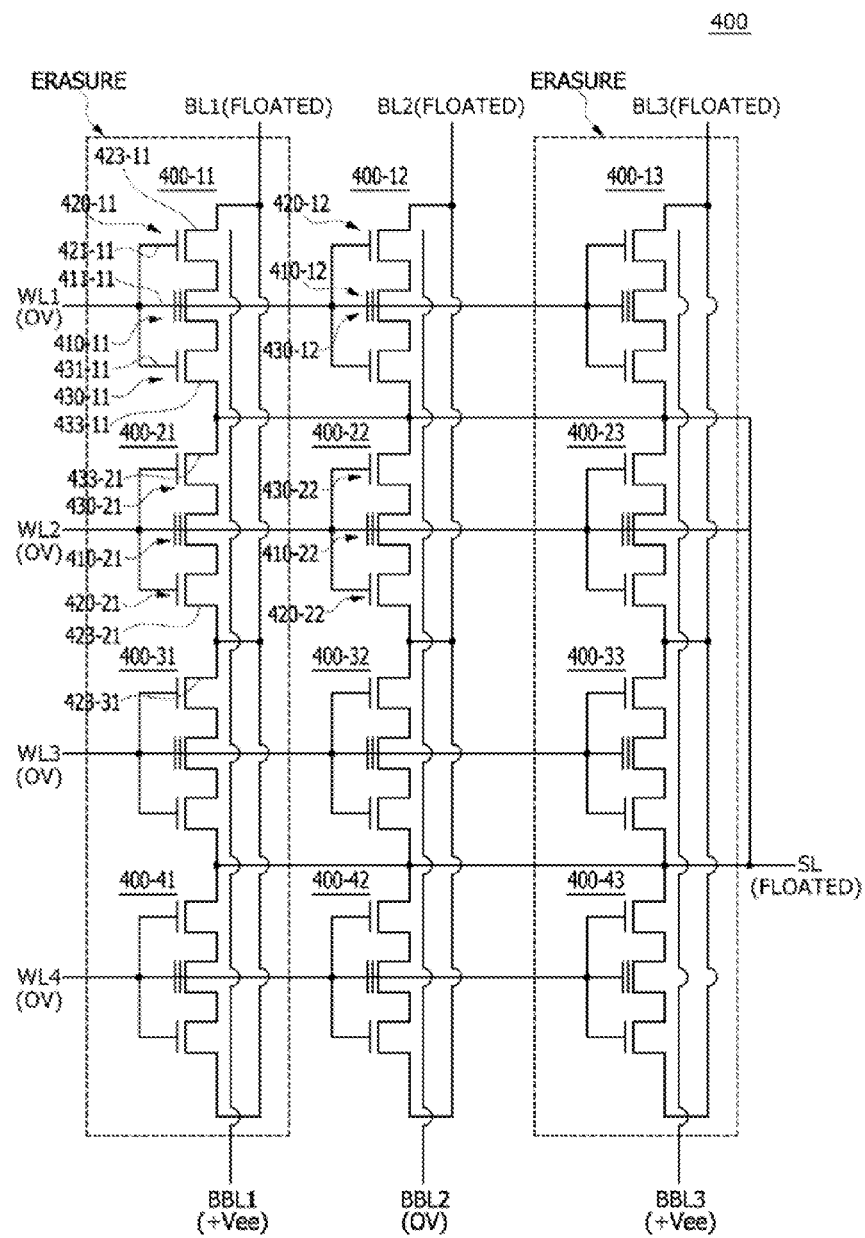
FIG. 24 is an equivalent circuit diagram illustrating another erasure operation of the nonvolatile memory cell array shown in FIG. 15.

FIG. 24 is an equivalent circuit diagram illustrating another erasure operation of the nonvolatile memory cell array 400 shown in FIG. 15. In FIG. 24, the same reference numerals or characters as used in FIG. 15 denote the same elements. The erasure operation illustrated in FIG. 24 may be executed to simultaneously erase a plurality of pages included in the nonvolatile memory cell array 400.

Referring to FIG. 24, the erasure operation illustrates an example for erasing unit cells such as, the unit cells 400-11, 400-21, 400-31 and 400-41 arrayed in the first column, sharing the first bit line BL1 and the first body bias line BBL1 with each other and unit cells such as, the unit cells 400-13, 400-23, 400-33 and 400-43 arrayed in the third column, sharing the third bit line BL3 and the third body bias line BBL3 with each other. Specifically, all of the word lines WL1~WL4 may be grounded, and all of the bit lines BL1~BL3 and the source line SL may be floated. The positive erasure voltage +Vee may be applied to the first and third body bias lines BBL1 and BBL3 connected to the selected pages to be erased, and the remaining body bias line BBL2 may be grounded.

Under the above bias condition, the unit cells 400-11, 400-21, 400-31, 400-41, 400-13, 400-23, 400-33 and 400-43 arrayed in the first and third columns may be simultaneously erased by the same mechanism as described with reference to FIG. 22 since the word lines WL1~WL4 are grounded and the positive erasure voltage +Vee is applied to the first and third body bias lines BBL1 and BBL3. In contrast, the unit cells 400-12, 400-22, 400-32 and 400-42 arrayed in the second column may not be erased by the same mechanism as described with reference to FIG. 23 since all of the word lines WL1~WL4 and the second body bias lines BBL2 are grounded.

Figure 25:
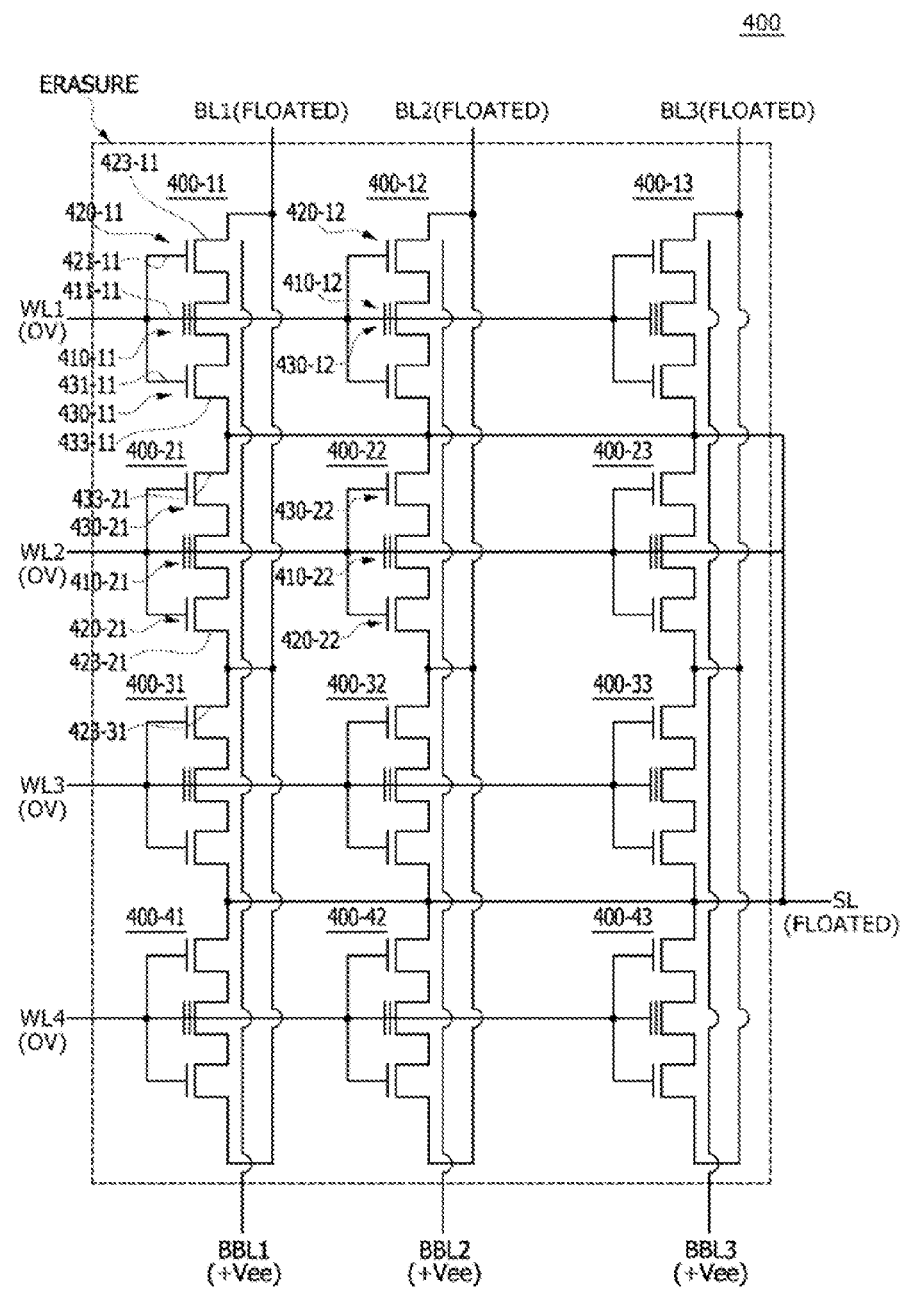
FIG. 25 is an equivalent circuit diagram illustrating still another erasure operation of the nonvolatile memory cell array shown in FIG. 15.

FIG. 25 is an equivalent circuit diagram illustrating still another erasure operation of the nonvolatile memory cell array 400 shown in FIG. 15. In FIG. 25, the same reference numerals or characters as used in FIG. 15 denote the same elements. The erasure operation illustrated in FIG. 25 may be executed to simultaneously erase all of pages included in the nonvolatile memory cell array 400.

Referring to FIG. 25, all of the word lines WL1~WL4 may be grounded, and all of the bit lines BL1~BL3 and the source line SL may be floated. In addition, the positive erasure voltage +Vee may be applied to all of the first to third body bias lines BBL1, BBL2 and BBL3. Under the above bias condition, all of the unit cells 400-11, 400-21, 400-31, 400-41, 400-12, 400-22, 400-32, 400-42, 400-13, 400-23, 400-33 and 400-43 may be simultaneously erased by the same mechanism as described with reference to FIG. 22 since all of the word lines WL1~WL4 are grounded and the positive erasure voltage +Vee is applied to all of the body bias lines BBL1~BBL3.

Figure 26:
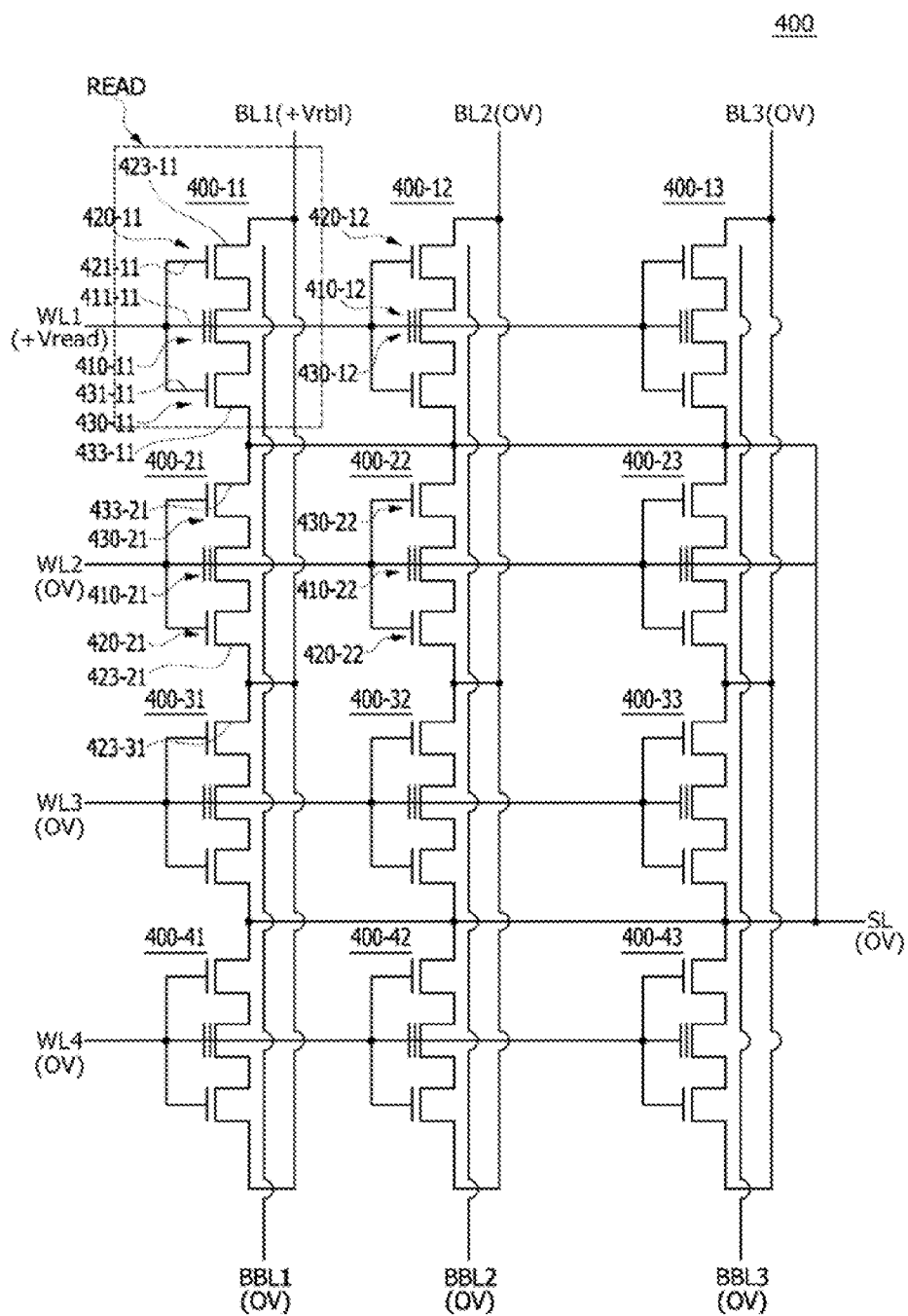
FIG. 26 is an equivalent circuit diagram illustrating a read operation of the nonvolatile memory cell array shown in FIG. 15.

FIG. 26 is an equivalent circuit diagram illustrating a read operation of the nonvolatile memory cell array 400 shown in FIG. 15. In FIG. 26, the same reference numerals or characters as used in FIG. 15 denote the same elements. The read operation illustrated in FIG. 26 will be described in conjunction with an example in which data stored in the unit cell 400-11 hereinafter, referred to as a selected unit cell, located at a cross point of the first row and the first column is selectively read. The read operation illustrated in FIG. 26 may be equally applied to a method of reading the other unit cells.

Referring to FIG. 26, a positive read voltage +Vread may be applied to the first word line WL1 connected to the selected unit cell 400-11, and the remaining word lines WL2, WL3 and WL4 may be grounded. A positive read bit line voltage +Vrbl may be applied to the first bit line BL1 connected to the selected unit cell 400-11, and the remaining bit lines BL2 and BL3 may be grounded.

In addition, all of the body bias lines BBL1~BBL3 and the source line SL may be grounded. The positive read voltage +Vread may be set to have a voltage level between a threshold voltage of a charge storage element of a unit cell in an erased state and a threshold voltage of a charge storage element of a unit cell in a programmed state. Moreover, the positive read voltage +Vread may be set to have a voltage level which is capable of turning on the first and second selection transistors of each of the unit cells. That is, the positive read voltage +Vread may be set to have a voltage level which is higher than threshold voltages of the first and second selection transistors.

Figure 27:
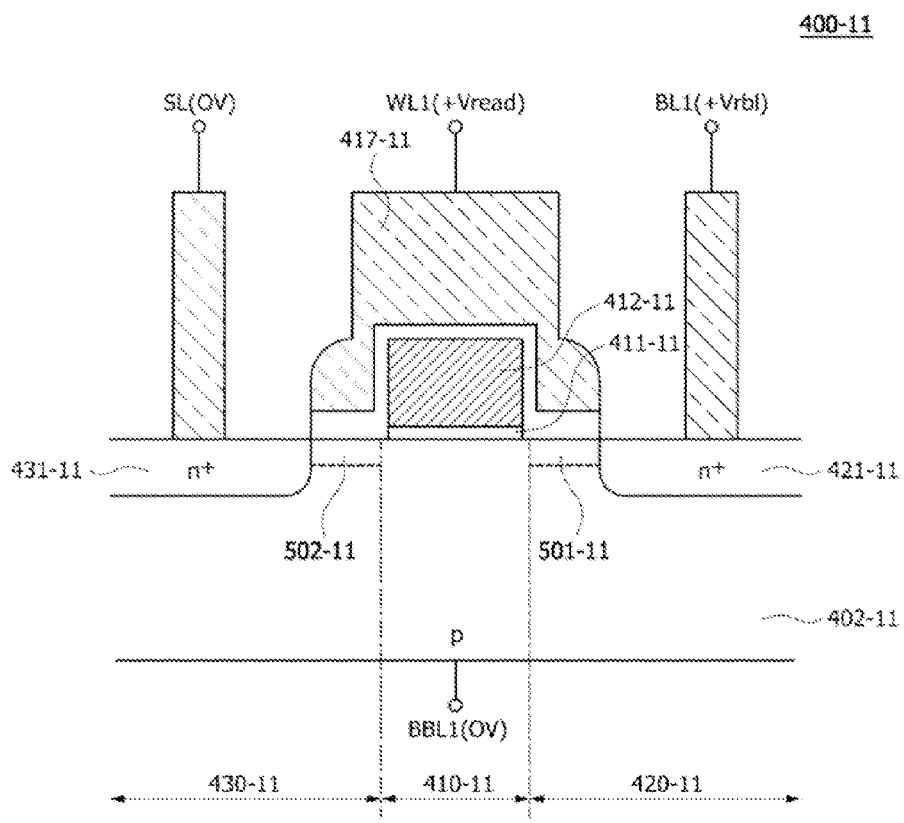
FIG. 27 is a cross-sectional view illustrating a read operation of a selected and programmed unit cell of the nonvolatile memory cell array shown in FIG. 26.

FIG. 27 is a cross-sectional view illustrating a read operation of a selected and programmed unit cell 400-11 of the nonvolatile memory cell array 400 shown in FIG. 26. As illustrated in FIG. 27, the positive read voltage +Vread may be applied to a first contact plug 417-11 of the selected unit cell 400-11 through the first word line WL1 and a body 402-11 of the selected unit cell 400-11 may be grounded. Thus, a first channel inversion layer 501-11 of an N-type region may be formed in a channel region of the first selection transistor 420-11, and a second channel inversion layer 502-11 of an N-type region may be formed in a channel region of the second selection transistor 430-11. In addition, a certain coupling voltage may be induced at a floating gate 412-11 of the charge storage element 410-11.

Formation of a channel inversion layer in a channel region of the charge storage element 410-11 may depend on whether the coupling voltage is induced at the floating gate 412-11. If the charge storage element 410-11 is in a programmed state and has a threshold voltage higher than the positive read voltage +Vread, the channel inversion layer is not formed in a channel region of the charge storage element 410-11 even though the positive read voltage +Vread is applied to the first word line WL1. Accordingly, no current path is formed between the first and second channel inversion layers 501-11 and 50241.

In such a case, even if a horizontal electric field is created between the first and second channel inversion layers 501-11 and 502-11 by the positive read bit line voltage +Vrbl applied to the first bit line BL1 and a ground voltage applied to the source line SL, no current flows from the first channel inversion layer 501-11 toward the second channel inversion layer 502-11. As a result, no current flows through the first bit line BL1. Thus, the selected unit cell 400-11 may be determined as a unit cell in a programmed state.

Figure 28:
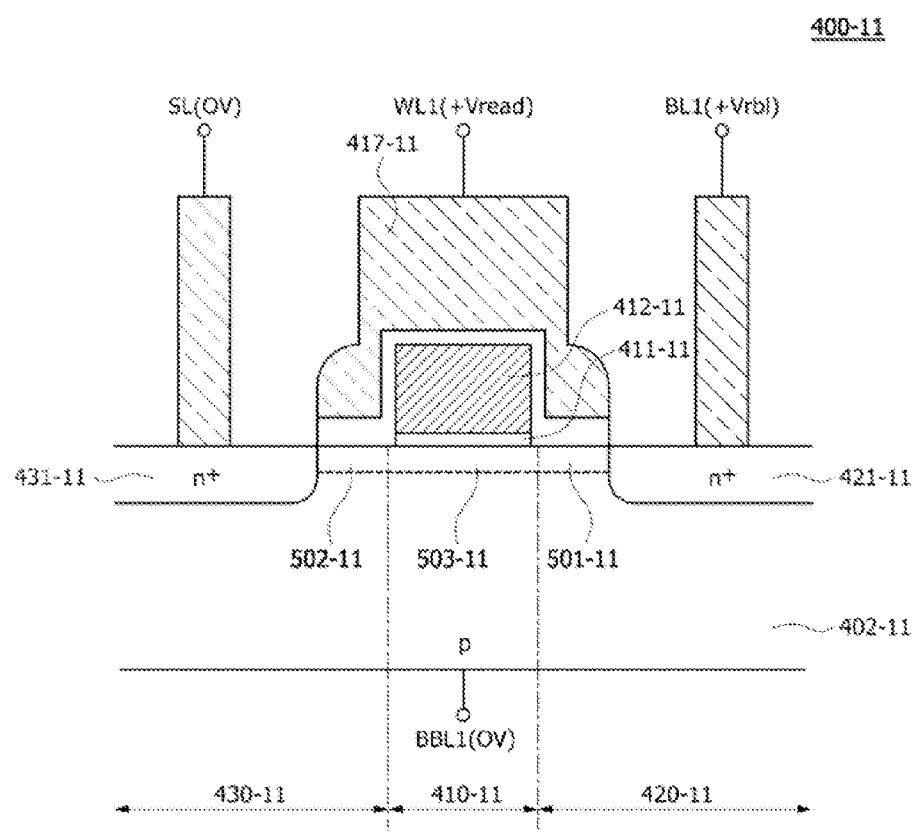
FIG. 28 is a cross-sectional view illustrating a read operation of a selected and erased unit cell of the nonvolatile memory cell array shown in FIG. 26.

FIG. 28 is a cross-sectional view illustrating a read operation of a selected and erased unit cell 400-11 of the nonvolatile memory cell array 400 shown in FIG. 26. As illustrated in FIG. 28, if the selected unit cell 400-11 is in an erased state and has a threshold voltage lower than the positive read voltage +Vread, a third channel inversion layer 503-11 may be formed in a channel region of the charge storage element 410-11 when the positive read voltage +Vread is applied to the first word line WL1. Thus, a current path comprised of the first, second and third channel inversion layers 501-11, 502-11 and 503-11 may be formed between the first impurity junction region 421-11 and the second impurity junction region 431-11.

In such a case, if the positive read bit line voltage +Vrbl is applied to the first bit line BL1 and a ground voltage is applied to the source line SL, a current may flow from the first impurity junction region 421-11 toward the second impurity junction region 431-11. That is, a current may flow through the first bit line BL1. Thus, the selected unit cell 400-11 may be determined as a unit cell in an erased state.

Figure 29:
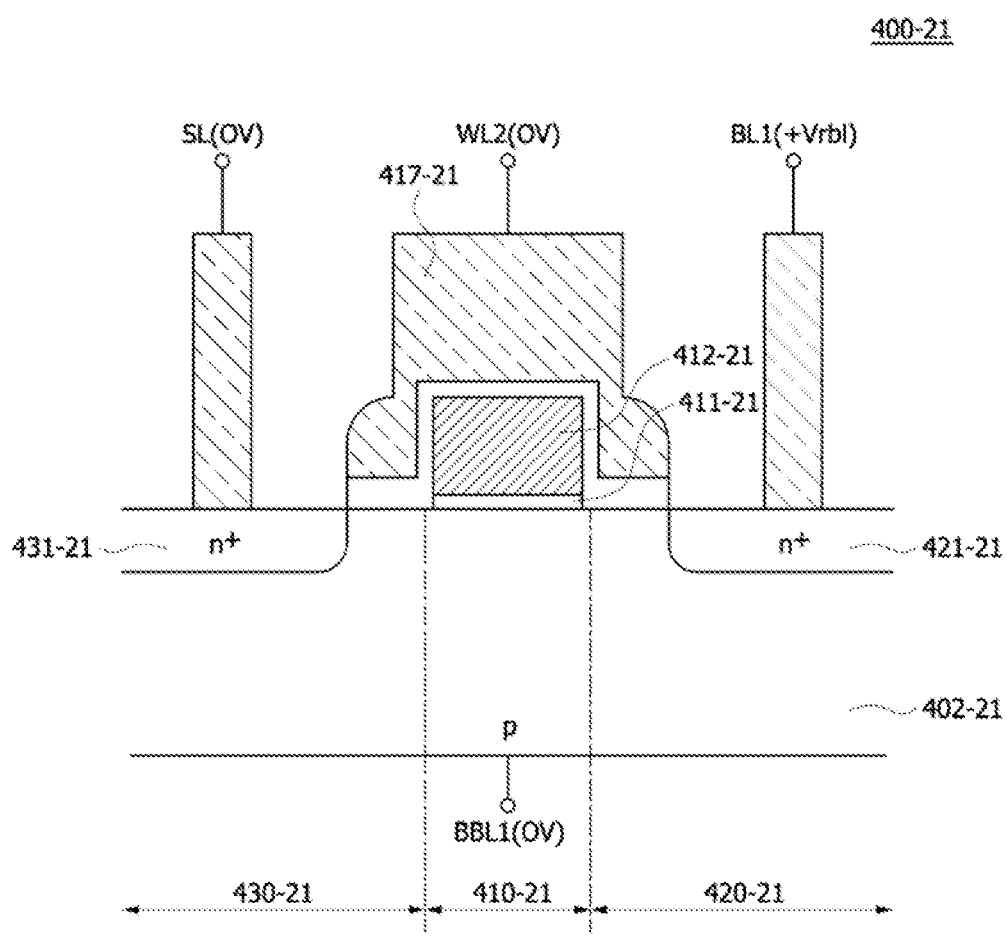
FIG. 29 is a cross-sectional view illustrating an operation of a non-selected unit cell sharing a bit line with a selected unit cell of the nonvolatile memory cell array shown in FIG. 26 during a read operation of the selected unit cell.

FIG. 29 is a cross-sectional view illustrating an operation of a non-selected unit cell 400-21 sharing the first bit line BL1 with the selected unit cell 400-11 of the nonvolatile memory cell array 400 shown in FIG. 26 during a read operation of the selected unit cell 400-11. Referring to FIG. 29, in the non-selected unit cell 400-21 sharing the first bit line BL1 with the selected unit cell 400-11, no channel inversion layer is formed in the charge storage element 410-21, the first selection transistor 420-21 and the second selection transistor 430-21 regardless of whether the non-selected unit cell 400-21 is programmed or erased since the second word line WL2 is grounded.

Thus, even if a horizontal electric field is created between the first and second impurity junction regions 421-21 and 431-21 by the positive read bit line voltage +Vrbl applied to the first bit line BL1 and a ground voltage applied to the source line SL, no current flows from the first impurity junction region 421-21 toward the second impurity junction regions 431-21. Accordingly, the read operation of the selected unit cell 400-11 may be correctly executed by sensing a current flowing through the first bit line BL1 regardless of whether the non-selected unit cell 400-21 is programmed or erased.

Figure 30:
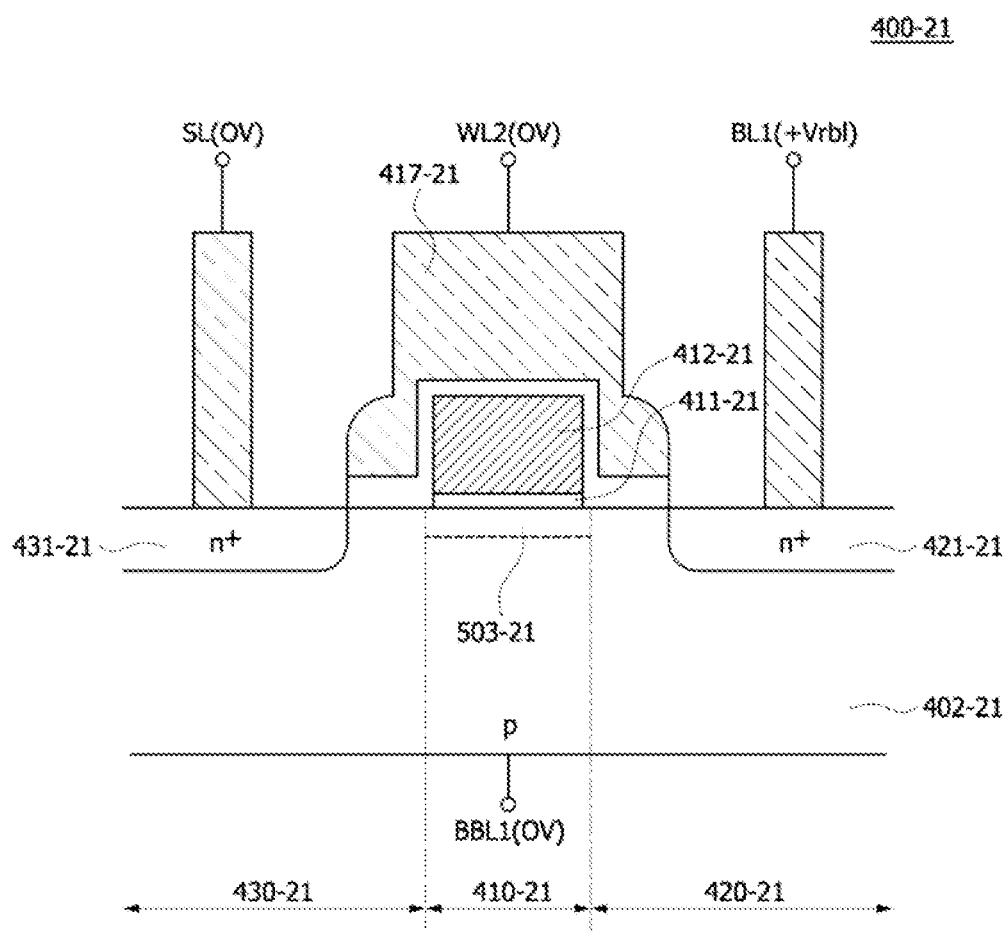
FIG. 30 is a cross-sectional view illustrating an operation of a non-selected and over-erased unit cell sharing a bit line with a selected unit cell of the nonvolatile memory cell array shown in FIG. 26 during a read operation of the selected unit cell.

FIG. 30 is a cross-sectional view illustrating an operation of a non-selected and over-erased unit cell 400-21 sharing the first bit line BL1 with the selected unit cell 400-11 of the nonvolatile memory cell array 400 shown in FIG. 26 during a read operation of the selected unit cell 400-11. Referring to FIG. 30, in the event that the non-selected unit cell 400-21 is in an over erased state and has a negative threshold voltage, a third channel inversion layer 503-21 may be formed in the charge storage element 410-21 when the second word line WL2 is grounded.

However, no channel inversion layer is formed in the first selection transistor 420-21 and the second selection transistor 430-21 since the word line W2 commonly coupled to the first selection transistor 420-21 and the second selection transistor 430-21 is grounded. Under this bias condition, the first selection transistor 420-21 and the second selection transistor 430-21 are off. See FIG. 6. Thus, even if a horizontal electric field is created between the first and second impurity junction regions 421-21 and 431-21 by the positive read bit line voltage +Vrbl applied to the first bit line BL1 and a ground voltage applied to the source line SL, no current flows from the first impurity junction region 421-21 toward the second impurity junction regions 431-21. Accordingly, the read operation of the selected unit cell 400-11 may be correctly executed by sensing a current flowing through the first bit line BL1 even though the non-selected unit cell 400-21 is over-erased.

Figure 31:
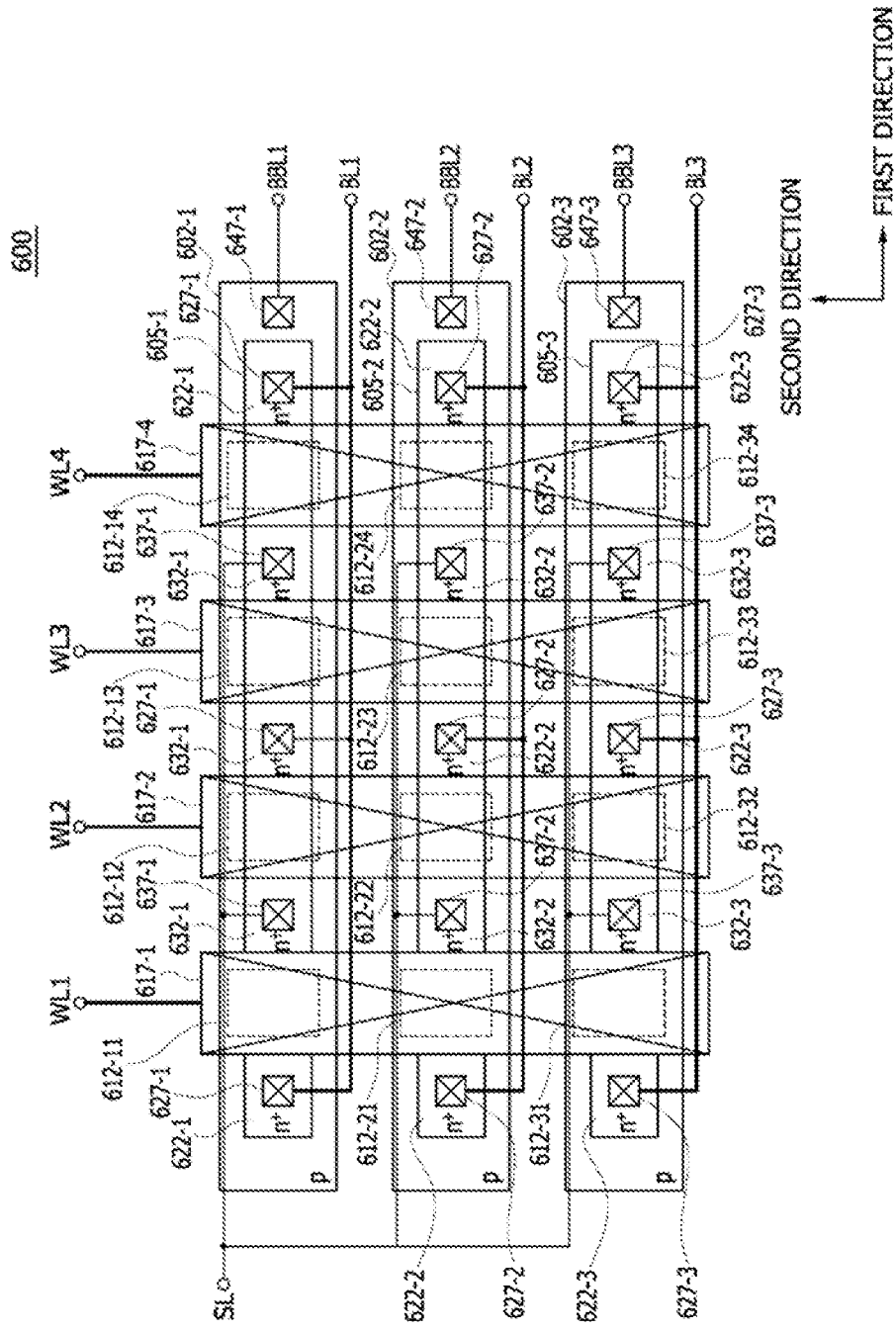
FIG. 31 is a layout diagram illustrating a nonvolatile memory cell array according to an embodiment.

FIG. 31 is a layout diagram illustrating a nonvolatile memory cell array 600 according to an embodiment. Referring to FIG. 31, the nonvolatile memory cell array 600 may include a plurality of unit cells which are located at cross points of a plurality of rows and a plurality of columns. The nonvolatile memory cell array 600 may include a plurality of active regions, for example, first to third active regions 605-1, 605-2 and 605-3 that are disposed in a first direction. The first to third active regions 605-1, 605-2 and 605-3 may be spaced apart from each other in a second direction intersecting the first direction.

The first to third active regions 605-1, 605-2 and 605-3 may be defined by an isolation region. The first active region 605-1 may be surrounded by a first body 602-1 having a P-type conductivity. The second active region 605-2 may be surrounded by a second body 602-2 having a P-type conductivity. The third active region 605-3 may be surrounded by a third body 602-3 having a P-type conductivity. In some embodiments, each of the first, second, and third bodies 602-1, 602-2 and 602-3 may correspond to a well region. The first, second, and third active regions 605-1, 605-2 and 605-3 may be disposed in the rows, respectively. For example, the first, second, and third active regions 605-1, 605-2 and 605-3 may be disposed in first, second, and third rows, respectively. The number of rows and the number of unit cells arrayed in each row may vary according to the embodiments.

A plurality of floating gates 612-11, 612-12, 612-13 and 612-14 may be arrayed on the first active region 605-1 in the first direction. Although not shown in FIG. 31, a tunnel insulation layer may be disposed between the first active region 605-1 and each of the floating gates 612-11, 612-12, 612-13 and 612-14.

A plurality of floating gates 612-21, 612-22, 612-23 and 612-24 may be arrayed on the second active region 605-2 which extends in the first direction. Although not shown in FIG. 31, the tunnel insulation layer may be disposed between the second active region 605-2 and each of the floating gates 612-21, 612-22, 612-23 and 612-24. A plurality of floating gates 612-31, 612-32, 612-33 and 612-34 may be arrayed on the third active region 605-3 which extends in the first direction. Although not shown in FIG. 31, the tunnel insulation layer may be disposed between the third active region 605-3 and each of the floating gates 612-31, 612-32, 612-33 and 612-34.

A plurality of first contact plugs 617-1, 617-2, 617-3 and 617-4 may be disposed to cover the floating gates 612-11~612-31, 612-12~612-32, 612-13~612-33 and 612-14~612-34 and may extend in the second direction. The first contact plugs 617-1, 617-2, 617-3 and 617-4 may cover portions of the active regions adjacent to both sides of the floating gates. The first contact plugs 617-1, 617-2, 617-3 and 617-4 may be spaced apart from each other in the first direction.

The first contact plugs 617-1, 617-2, 617-3 and 617-4 may be disposed in first, second, third and fourth columns of the nonvolatile memory cell array 600, respectively. The first contact plug 617-1 disposed in the first column may overlap with the floating gates 612-11, 612-21 and 612-31. An insulation layer (not shown) may be disposed between the first contact plug 617-1 and each of the floating gates 612-11, 612-21 and 612-31. A gate insulation layer (not shown) may be disposed between the first contact plug 617-1 and the active regions 605-1, 605-2 and 605-3 adjacent to both sides of the floating gates 612-11, 612-21 and 612-31.

The first contact plug 617-2 disposed in the second column may overlap with the floating gates 612-12, 612-22 and 612-32. The insulation layer may be disposed between the first contact plug 617-2 and each of the floating gates 612-12, 612-22 and 612-32. The gate insulation layer may be disposed between the first contact plug 617-2 and the active regions 605-1, 605-2 and 605-3 adjacent to both sides of the floating gates 612-12, 612-22 and 612-32.

The first contact plug 617-3 disposed in the third column may overlap with the floating gates 612-13, 612-23 and 612-33. The insulation layer may be disposed between the first contact plug 617-3 and each of the floating gates 612-13, 612-23 and 612-33. The gate insulation layer may be disposed between the first contact plug 617-3 and the active regions 605-1, 605-2 and 605-3 adjacent to both sides of the floating gates 612-13, 612-23 and 612-33.

The first contact plug 617-4 disposed in the fourth column may overlap with the floating gates 612-14, 612-24 and 612-34. The insulation layer may be disposed between the first contact plug 617-4 and each of the floating gates 612-14, 612-24 and 612-34. The gate insulation layer may be disposed between the first contact plug 617-4 and the active regions 605-1, 605-2 and 605-3 adjacent to both sides of the floating gates 612-14, 612-24 and 612-34.

A first impurity junction region 622-1 having an N-type conductivity and a second impurity junction region 632-1 having an N-type conductivity may be disposed in portions of the first active region 605-1 adjacent to both sides of each of the first contact plugs 617-1, 617-2, 617-3 and 617-4, respectively. A second contact plug 627-1 may be disposed on each of the first impurity junction regions 622-1, and a third contact plug 637-1 may be disposed on each of the second impurity junction regions 632-1.

A first impurity junction region 622-2 having an N-type conductivity and a second impurity junction region 632-2 having an N-type conductivity may be disposed in portions of the second active region 605-2 adjacent to both sides of each of the first contact plugs 617-1, 617-2, 617-3 and 617-4, respectively. A second contact plug 627-2 may be disposed on each of the first impurity junction regions 622-2, and a third contact plug 637-2 may be disposed on each of the second impurity junction regions 632-2. A first impurity junction region 622-3 having an N-type conductivity and a second impurity junction region 632-3 having an N-type conductivity may be disposed in portions of the third active region 605-3 adjacent to both sides of each of the first contact plugs 617-1, 617-2, 617-3 and 617-4, respectively. A second contact plug 627-3 may be disposed on each of the first impurity junction regions 622-3 and a third contact plug 637-3 may be disposed on each of the second impurity junction regions 632-3.

The first contact plugs 617-1, 617-2, 617-3 and 617-4 may be electrically connected to first, second, third and fourth word lines WL1, WL2, WL3 and WL4, respectively. The second contact plugs 627-1 disposed in the first row may be connected to a first bit line BL1. The second contact plugs 627-2 disposed in the second row may be connected to a second bit line BL2. The second contact plugs 627-3 disposed in the third row may be connected to a third bit line BL3. All of the third contact plugs 637-1, 637-2 and 637-3 may be connected to a single source line SL. The first body 602-1 may be electrically connected to a first body bias line BBL1 through a fourth contact plug 647-1. The second body 602-2 may be electrically connected to a second body bias line BBL2 through a fourth contact plug 647-2. The third body 602-3 may be electrically connected to a third body bias line BBL3 through a fourth contact plug 647-3.

The embodiments of the present disclosure have been disclosed above for illustrative purposes.

What is claimed is:

1. A nonvolatile memory device comprising:
    a charge storage element having a MOS capacitor structure and including a control gate terminal connected to a word line and a body terminal connected to a body bias line;
    a first half-MOS transistor having a first selection gate terminal connected to the word line and a first impurity junction terminal connected to a bit line and sharing the body terminal with the charge storage element; and
    a second half-MOS transistor having a second selection gate terminal connected to the word line and a second impurity junction terminal connected to a source line and sharing the body terminal with the charge storage element,
    wherein the charge storage element is coupled between the first and second half-MOS transistors so that the first half-MOS transistor, the charge storage element, and the second half-MOS transistor are connected in series.

2. The nonvolatile memory device of claim 1, wherein the first impurity junction terminal is disposed at a first side of the charge storage element.

3. The nonvolatile memory device of claim 1, wherein the second impurity junction terminal is disposed at a second side of the charge storage element.

4. The nonvolatile memory device of claim 1, wherein each of the charge storage element, the first half-MOS transistor, and the second half-MOS transistor has an N-channel MOS structure.

5. A nonvolatile memory cell array including a plurality of unit cells arrayed in rows and columns in a matrix form, each of the plurality of unit cells comprising:
    a charge storage element having a MOS capacitor structure including a control gate terminal connected to a word line and a body terminal connected to a body bias line;
    a first half-MOS transistor having a first selection gate terminal connected to the word line and a first impurity junction terminal connected to a bit line and sharing the body terminal with the charge storage element; and a second half-MOS transistor having a second selection gate terminal connected to the word line and a second impurity junction terminal connected to a source line and sharing the body terminal with the charge storage element, wherein the charge storage element is coupled between the first and second half-MOS transistors so that the first half-MOS transistor, the charge storage element and the second half-MOS transistor are connected in series.

6. The nonvolatile memory cell array of claim 5, wherein the word line is any one of a plurality of word lines disposed in the rows, respectively, wherein the body bias line is any one of a plurality of body bias lines disposed in the columns, respectively, and wherein the unit cells disposed in each row share one of the plurality of word lines with each other.

7. The nonvolatile memory cell array of claim 5, wherein the bit line is any one of a plurality of bit lines disposed in the columns, respectively, wherein the body bias line is any one of a plurality of body bias lines disposed in the columns, respectively, and wherein the unit cells disposed in each column share one of the plurality of bit lines and one of the plurality of body bias lines with each other.

8. The nonvolatile memory cell array of claim 5, wherein the plurality of unit cells share the source line with each other.

9. The nonvolatile memory cell array of claim 5, wherein the second impurity junction terminals of unit cells arrayed in an $N^{th}$ row are connected to the second impurity junction terminals of unit cells arrayed in an $(N+1)^{th}$ row, respectively, wherein the first impurity junction terminals of the unit cells arrayed in the $N^{th}$ row are connected to the first impurity junction terminals of the unit cell arrayed in an $(N-1)^{th}$ row of, respectively, and wherein N is an integer.

* * * * *